(12) United States Patent
Collamati et al.

(10) Patent No.: US 12,506,457 B2
(45) Date of Patent: Dec. 23, 2025

(54) DC RESTORE SCHEME FOR CAPACITIVE SENSING AMPLIFIERS WITH OPTIMAL NOISE FILTERING

(71) Applicant: InvenSense, Inc., San Jose, CA (US)

(72) Inventors: Luca Collamati, Jesi (IT); Federico Mazzarella, Binasco (IT)

(73) Assignee: InvenSense, Inc., San Jose, CA (US)

( * ) Notice: Subject to any disclaimer, the term of this patent is extended or adjusted under 35 U.S.C. 154(b) by 516 days.

(21) Appl. No.: 18/070,081

(22) Filed: Nov. 28, 2022

(65) Prior Publication Data

US 2024/0186971 A1  Jun. 6, 2024

(51) Int. Cl.
*H03F 3/70* (2006.01)
*G01D 5/24* (2006.01)
*G01P 15/125* (2006.01)
*G01P 15/14* (2013.01)

(52) U.S. Cl.
CPC .................. *H03F 3/70* (2013.01); *G01D 5/24* (2013.01); *G01P 15/125* (2013.01); *G01P 15/14* (2013.01)

(58) Field of Classification Search
CPC ............. H03F 3/70; H03F 2203/45512; H03F 2203/45514; H03F 3/45475; G01D 5/24; G01P 15/125; G01P 15/14; G01C 19/5776

USPC ....................... 330/85, 252–261, 9
See application file for complete search history.

(56) References Cited

U.S. PATENT DOCUMENTS 10,574,259 B2 *  2/2020  Chen ...................... H03M 5/02
2022/0252439 A1    8/2022  Dewall

FOREIGN PATENT DOCUMENTS

| CN | 112947659 A | 6/2021 |
| CN | 108075738 B | 10/2021 |
| CN | 216700314 U | 6/2022 |
| CN | 115327166 A | 11/2022 |
| WO | 2012/089619 A1 | 7/2012 |

* cited by examiner

*Primary Examiner* — Hieu P Nguyen
(74) *Attorney, Agent, or Firm* — Van Hoven PC; Joshua Van Hoven

(57) ABSTRACT

A capacitive sensing charge amplifier, e.g., in a direct current (DC) feedback network, may incorporate a switching capacitor, including a first control switch and a second control switch, which receives a switching signal to charge and discharges the switching signal to a virtual ground of a sense amplifier. Noise incorporated into the output of the sense amplifier (e.g., a MEMS output signal) is filtered by a demodulation signal at a demodulator such that the period average noise at the demodulator output equals zero. The time varying nature of the switching capacitor resistance generally reshapes the system's post-demodulation noise to reduce its low frequency output noise.

20 Claims, 12 Drawing Sheets

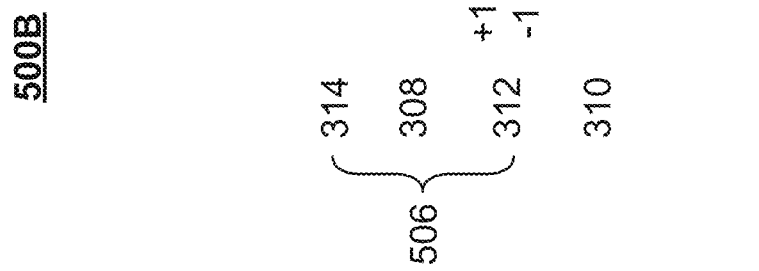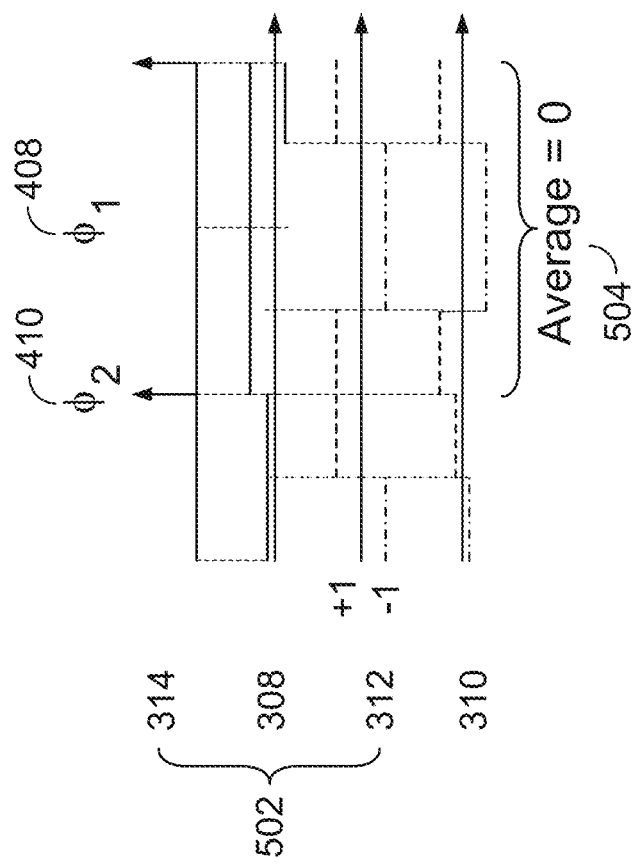

DC RESTORE SCHEME FOR CAPACITIVE SENSING AMPLIFIERS WITH OPTIMAL NOISE FILTERING

BACKGROUND

Numerous items such as smart phones, smart watches, tablets, automobiles, aerial drones, appliances, aircraft, exercise aids, and game controllers may utilize sensors such as microelectromechanical system (MEMS) sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

MEMS sensors may be fabricated using semiconductor manufacturing techniques. A MEMS sensor may include movable proof masses that can respond to forces such as linear acceleration (e.g., for MEMS accelerometers), angular velocity (e.g., for MEMS gyroscopes), pressure, and magnetic field. The operation of these forces on the movable proof masses may be measured based on the movement of the proof masses in response to the forces. In some implementations, this movement is measured based on distance between the movable proof masses and fixed electrodes, which form capacitors for sensing the movement.

The MEMS sensor may include multiple layers that are manufactured to collectively form the sensor cavity and components, such as a MEMS layer, cap layer, and base substrate layer. These layers typically have parallel surfaces with respect to each other. The movable proof masses may be located in the MEMS layer. When fixed electrodes are also located within the MEMS layer, movement of the movable proof masses within the MEMS layer (in-plane movement) relative to the fixed electrodes may be used to measure a force along a plane of the MEMS layer. When fixed electrodes are located on another layer, movement of the movable proof masses outside the plane of the MEMS layer (out-of-plane movement) relative to the fixed electrodes may be used to measure a force out of the plane of the MEMS layer (e.g., perpendicular to the MEMS layer). The MEMS sensors may be designed based on expected relative locations of the movable proof masses and the fixed electrodes, both in the absence of external forces and in response to external forces. If a particular MEMS sensor departs from those expected relative locations due to factors such as manufacturing tolerances, wear, or external stresses applied to the sensor, the measurement of the desired force by the sensor may be inaccurate.

MEMS sensors are designed to provide low noise when measuring linear acceleration, angular velocity, air pressure, a magnetic field, etc. In some embodiments, MEMS sensors may utilize a low noise charge front-end amplifier and a demodulator to improve the signal-to-noise ratio of the system during operation. However, the charge amplifier may contribute noise to the low noise applications of the MEMS sensor. Further, MEMS sensors may implement continuous time feedback (e.g., with a MOSFET) that provides the same impedance at direct current (DC) voltage (e.g., when f=0 Hz) and at the driving frequency (e.g., including a tradeoff between noise and DC biasing). In some embodiments, MEMS sensors may include a switching capacitor feedback network without a proper phase relationship between a switching signal and a demodulation signal. In some embodiments, MEMS sensors may implement a reset feedback network where a post-trimming static offset appears after soldering.

SUMMARY

In an embodiment of the present disclosure, a MEMS device comprises a MEMS structure comprising a capacitive output corresponding to movement of the MEMS structure, a sense amplifier with a first node, a second node, and an output node, where a feedback capacitor and a switching capacitor are each connected in parallel between the first node and the output node, and a demodulator coupled to the output node. The MEMS device may further comprise a signal generator configured to output a demodulation signal to the demodulator and a switching signal to a first control switch and a second control switch of the switching capacitor, where the first control switch is connected between a first side of the switching capacitor and the output node, and where the second control switch is connected between a second side of the switching capacitor and the first node.

In an embodiment of the present disclosure, a method comprises receiving a capacitive output from a MEMS structure at a first node of a sense amplifier, applying a switching signal to charge a switching capacitor based on a first portion of a duty cycle of the switching signal, and applying the switching signal to discharge the switching capacitor to a virtual ground, where the virtual ground is the first node of the sense amplifier, and where the discharge of the switching capacitor is based on a second portion of the duty cycle of the switching signal. The method may further comprise outputting, from an output node of the sense amplifier, a MEMS output signal, applying a demodulation signal to a demodulator, where the demodulator is coupled to the output node of the sense amplifier, and where a frequency of the switching signal is equal to or twice as great as a frequency of the demodulation signal, and demodulating the MEMS output signal based on the demodulation signal.

BRIEF DESCRIPTION OF DRAWINGS

The above and other features of the present disclosure, its nature, and various advantages will be more apparent upon consideration of the following detailed description, taken in conjunction with the accompanying drawings in which:

FIG. 5A shows an illustrative waveform where a switching signal frequency equals a demodulation signal frequency and the switching signal is in quadrature with the demodulation signal, in accordance with an embodiment of the present disclosure;

FIG. 5B shows an illustrative waveform where the switching signal frequency is double the demodulation signal frequency, and the switching signal is in quadrature with the demodulation signal in accordance with an embodiment of the present disclosure;

DETAILED DESCRIPTION

Example illustrations herein are generally directed to a microelectromechanical system (MEMS) device or system employing a sense amplifier and demodulator. A switching arrangement connected in parallel with the sense amplifier may be actuated by a switching signal generator. Example switching arrangements may employ a switching capacitor. A switching signal that is output by the switching signal generator may be configured to reduce or eliminate noise at an output of the demodulator (e.g., which might otherwise result due to resistance from the switching arrangement).

In at least some approaches, the switching signal may have a frequency and a phase shift that is based upon, related to, or associated with a demodulator signal generated by the signal generator. In one example, a frequency of the switching signal is equal to or twice as great as a demodulator signal frequency, and the switching signal also has a phase shift relative to the demodulator signal. In an example, a phase of the switching signal is shifted relative to the demodulator signal such that the switching signal is in quadrature with respect to the demodulator signal. As will be discussed further below, in at least some approaches a switching signal in quadrature with a demodulator signal has a phase shift of 90 degrees relative to the demodulator signal. In another example, a switching signal in quadrature with respect to the demodulator signal has a phase shift relative to the demodulator signal that is within a range of 90 degrees relative to the demodulator signal, e.g., such that the phase shift is 85-95 degrees.

In example approaches herein, period average noise due to a switching capacitor resistor at an output of the demodulator is kept to a minimum as a result of the foregoing characteristics of the switching signal. As a result, the switching capacitor resistor noise at an output of the sense amplifier generally does not contribute to a period average noise at demodulator output (i.e., the DC noise) because the average over a demodulator period is zero. Moreover, as will be discussed further below this reduction or elimination of noise is achieved across wide frequency ranges.

Figure 1:
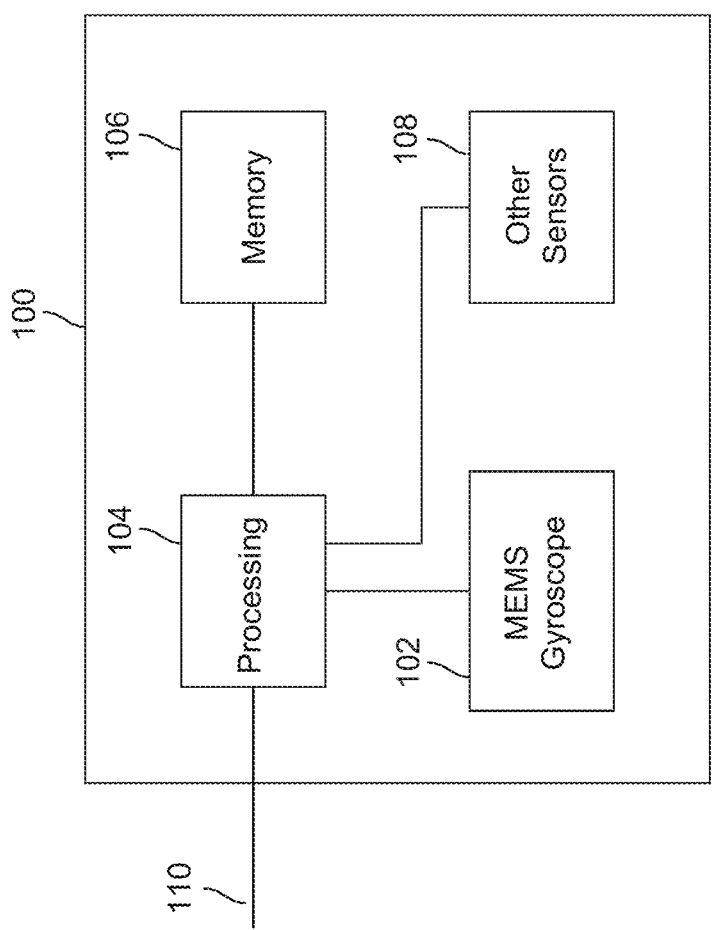
FIG. 1 shows an illustrative MEMS system in accordance with an embodiment of the present disclosure.

FIG. 1 shows an illustrative MEMS system 100 in accordance with an embodiment of the present disclosure. Although particular components are depicted in FIG. 1, it will be understood that other suitable combinations of the MEMS, processing components, memory, and other circuitry may be utilized as necessary for different applications and systems. In at least some embodiments, the circuitry, devices, systems, and methods described herein are described in the context of a system including processing circuitry configured to drive a switching capacitor. More specifically, in at least some examples, the processing circuitry is configured to drive a switching capacitor with a switching signal, generate a MEMS output signal via a sense amplifier, and demodulate the MEMS output signal based on a demodulation signal to significantly reduce output noise delivered to external components. It will be understood that the circuitry, devices, systems, and methods described herein may be applied to other types of MEMS devices or sensors.

Processing circuitry 104 may include one or more components providing processing based on the requirements of the MEMS system 100. In some embodiments, processing circuitry 104 may include hardware control logic that may be integrated within a chip of a sensor (e.g., on a base substrate of a MEMS gyroscope 102 or other sensor 108, or on an adjacent portion of a chip to the MEMS gyroscope 102 or other sensor 108) to control the operation of the MEMS gyroscope 102 or other sensors 108 and perform aspects of processing for the MEMS gyroscope 102 or the other sensors 108. In some embodiments, the MEMS gyroscope 102 and other sensors 108 may include one or more registers that allow aspects of the operation of hardware control logic to be modified (e.g., by modifying a value of a register). In some embodiments, processing circuitry 104 may also include a processor such as a microprocessor that executes software instructions, e.g., that are stored in memory 106. The microprocessor may control the operation of the MEMS gyroscope 102 by interacting with the hardware control logic and processing signals received from MEMS gyroscope 102. The microprocessor may interact with other sensors 108 in a similar manner. In some embodiments, some or all of the functions of the processing circuitry 104, and in some embodiments, of memory 106, may be implemented on an application specific integrated circuit ("ASIC") and/or a field programmable gate array ("FPGA"). In some embodiments, MEMS gyroscope 102 may be referred to as a variety of MEMS sensors (e.g., an accelerometer, a barometer, an inertial measurement unit, a magnetometer, etc.).

Although in some embodiments (not depicted in FIG. 1), the MEMS gyroscope 102 or other sensors 108 may communicate directly with external circuitry (e.g., via a serial bus or direct connection to sensor outputs and control inputs), in an embodiment the processing circuitry 104 may process data received from the MEMS sensor 102 and other sensors 108 and communicate with external components via a communication interface 110 (e.g., a serial peripheral interface (SPI) or I2C bus, in automotive applications a controller area network (CAN) or Local Interconnect Network (LIN) bus, or in other applications a suitably wired or wireless communications interface as is known in the art). The processing circuitry 104 may convert signals received from the MEMS gyroscope 102 and other sensors 108 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place. In some embodiments, some or all of the conversions or calculations may take place on the hardware control logic or other on-chip processing of the MEMS gyroscope 102 or other sensors 108.

In some embodiments, certain types of information may be determined based on data from multiple MEMS gyroscopes 102 and other sensors 108 in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In accordance with the present disclosure, a MEMS structure (e.g., MEMS gyroscope 102, an accelerometer, a barometer, an inertial measurement unit, a magnetometer, etc.) measures and delivers a capacitive output, which may correspond to movement of internal components (e.g., a proof mass relative to sense electrodes, forming moving capacitors) within the MEMS structure, to a first node of a sense amplifier (e.g., a virtual ground). The sense amplifier further includes a second node and an output node. A feedback capacitor and a switching capacitor, including a first control switch and a second control switch, may couple in parallel to the first node and the output node of the sense amplifier. A demodulator couples to the output node of the sense amplifier, and a signal generator delivers a switching signal to the first control switch and the second control switch of the switching capacitor in addition to a demodulation signal to the demodulator. The first control switch may connect between a first side of the switching capacitor and the output node of the sense amplifier, and the second control switch may connect between the same side of the switching capacitor and the first node of the sense amplifier (e.g., virtual ground). In some embodiments, the switching capacitor charges during a first portion (e.g., $\phi_1$) of a duty cycle (e.g., period) of the switching signal when the first control switch is closed and the second control switch is open. Further, the switching capacitor may discharge to the first node of the sense amplifier (e.g., virtual ground) during a second portion (e.g., $\phi_2$) of the duty cycle of the switching signal when the first control switch is open and the second control switch is closed. In some embodiments, at a direct current (DC) a low circuit feedback impedance is desired to provide (e.g., bias) stable output voltage (low offset) for any leakage (e.g., leaking current contributing to a voltage drop across the sense amplifier) received from internal and external (e.g., MEMS and/or MEMS connections) circuitry connected to the first node of the sense amplifier. In some embodiments, a high circuit feedback impedance at the MEMS driving frequency, $f_{drive}$, is desired to significantly reduce noise generated by the sense amplifier (e.g., resulting in no feedback network noise).

As will be discussed further below, the switching behavior of the switching capacitor may be determined by a frequency of the switching signal, $f_{sw}$. In some embodiments, the frequency of the switching signal, $f_{sw}$, may be up to twice as great as the frequency of the demodulation signal, $f_{dmd}$ (e.g., $f_{sw}=N*f_{dmd}$, where N=1 or 2). The switching signal may either be in-phase or in quadrature (e.g., 90 degrees out-of-phase) with respect to the demodulation signal. In some embodiments, the switching signal may be 85 to 95 degrees out-of-phase with respect to the demodulation signal. When the frequency of the switching signal, $f_{sw}$, is equal to one or two times the frequency of the demodulation signal, $f_{dmd}$ (e.g., $f_{sw}=N*f_{dmd}$, where N=1 or 2), and the switching signal is in quadrature (e.g., 90 degrees out-of-phase or within a range thereof) with respect to the demodulation signal, sc2v amplifier noise generated by the switching capacitor resistance generally does not contribute to output noise (e.g., period average noise) at demodulator output because the average over the demodulator period is zero.

Figure 2:
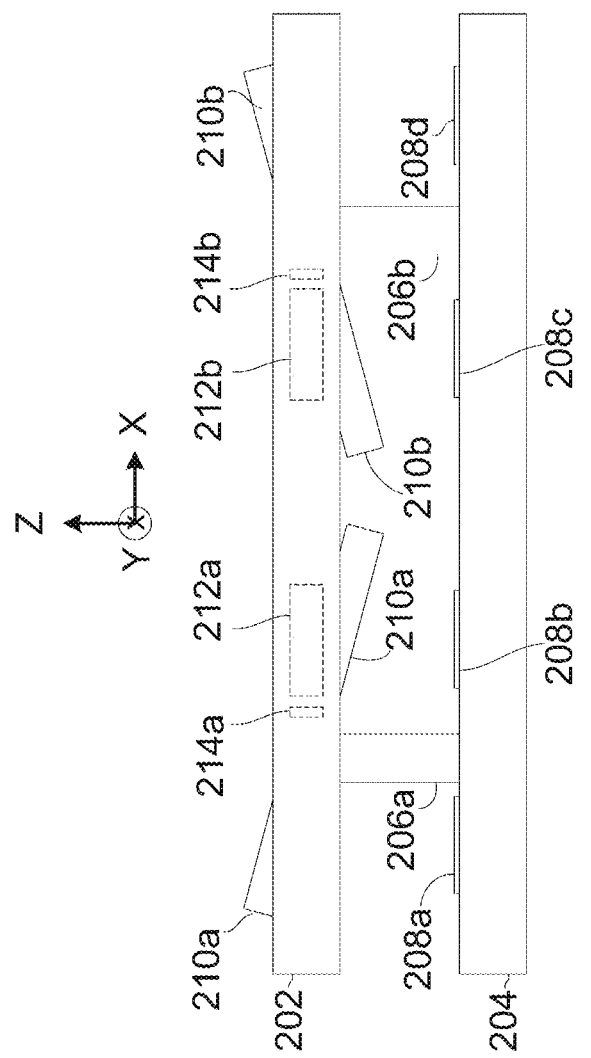
FIG. 2 shows an illustrative MEMS gyroscope in accordance with an embodiment of the present disclosure.

FIG. 2 shows an illustrative MEMS gyroscope 200 in accordance with an embodiment of the present disclosure. In an example, the MEMS gyroscope 200 may be employed as the MEMS gyroscope 102 described above in FIG. 1. The exemplary MEMS gyroscope 200 of FIG. 2 is simplified for the purposes of illustration. A MEMS gyroscope, as described in the present disclosure, may include any suitable MEMS gyroscope design, including single-axis or multi-axis MEMS gyroscopes. Although portions of the present disclosure may be described in the context of a particular type of MEMS gyroscope configuration (e.g., a single-axis out-of-plane sensing gyroscope), the present disclosure may apply equally to other types and configurations of MEMS devices.

As illustrated in FIG. 2, the MEMS gyroscope 200 may include MEMS layer 202, substrate layer 204 (e.g., a complementary metal-oxide-semiconductor (CMOS) substrate layer), and anchors 206a, 206b separating the layers and located within a gap between the two layers. Packaging and additional layers (e.g., a cap layer) are not shown in FIG. 2 for ease of illustration but may be coupled to the MEMS layer 202 and/or substrate layer 204 to form a hermetically sealed cavity in which the movable MEMS components of a suspended spring-mass system (e.g., drive masses 212a, 212b), Coriolis masses (not depicted), proof masses 210a, 210b, and additional springs and/or masses coupled thereto (not depicted) are able to move. The cavity may have a nominal pressure (e.g., at or near a vacuum pressure, or another suitable pressure for other particular designs). In the exemplary embodiment of FIG. 2, a bottom plane of the suspended spring-mass system of the MEMS layer 202 is located parallel to an upper plane of the substrate layer 204 and proof mass sense electrodes 208a-208d are located thereon. Drive mass sense electrodes 214a, 214b are located adjacent to the drive masses 212a, 212b for sensing movement thereof (e.g., imparted by drive electrodes, not depicted in FIG. 2).

MEMS layer 202 includes a suspended spring-mass system including proof masses 210a, 210b and drive masses 212a, 212b, which are suspended from anchors 206a, 206b, respectively, by interconnected springs and/or masses (not visible in FIG. 2). The components of the suspended spring-mass system are sized and configured in a manner to facilitate movement of the proof masses 210a, 210b in response to the movement of the drive masses 212a, 212b and an inertial force to be measured, e.g., angular velocity about an axis perpendicular to the drive axis. Although not depicted in FIG. 2, drive circuitry (e.g., a phase-locked loop (PLL)) may provide drive signals to the drive masses 212a, 212b of the suspended spring-mass system (e.g., via drive electrodes). For example, in a MEMS gyroscope, a drive signal may create a physical drive motion of one or more components (e.g., drive masses 212a, 212b) that in turn results in a Coriolis force experienced by the proof masses 210a, 210b when the gyroscope is rotated about an axis of interest. In an exemplary embodiment, the drive circuitry may provide the drive signal via one or more drive electrodes (e.g., a capacitive plate, comb electrode, etc.) located adjacent to components of the suspended spring-mass system (e.g., drive masses 212a, 212b, etc.). Drive mass sense electrodes 214a, 214b are each located at a fixed location adjacent to a respective drive mass 212a, 212b, and each outputs a signal (e.g., a capacitive signal) corresponding to the displacement of the respective drive mass 212a, 212b in response to the drive signal.

In the exemplary embodiment of FIG. 2, the proof masses are designed to move along the direction of the z-axis in response to the measured inertial force (e.g., rate of rotation or angular velocity for a gyroscope). For example, an illustrative MEMS gyroscope 200 includes a suspended spring-mass system including movable drive masses 212a, 212b and movable proof masses 210a, 210b, springs, and additional components such as lever arms and Coriolis masses (not depicted in FIG. 2 but located within and patterned from MEMS layer 202) connecting the drive masses to the proof masses. The springs and other movable components of the spring-mass system are coupled to the drive masses 212a, 212b and proof masses 210a, 210b and are selectively patterned and positioned such that they are relatively rigid in response to forces in directions in which it is not desired to impart the drive motion, or measure the inertial force, and relatively flexible in a direction in which a force is to be imparted or measured.

Proof mass 210a is suspended over proof mass sense electrodes 208a, 208b and proof mass 210b is suspended over proof mass sense electrodes 208c, 208d. In response to a z-axis movement of the proof masses due to an angular velocity experienced by a MEMS gyroscope (e.g., due to rotation of a device including a MEMS gyroscope about an axis perpendicular to the z-axis and the axis of the drive motion imparted by drive masses 212a, 212b), the proof masses 210a, 210b rotate out of the plane of the MEMS layer (e.g., about the y-axis) such that portions of the proof mass move closer to or farther away from respective proof mass sense electrodes, with the degree of rotation (e.g., how much the proof masses move with respect to the respective proof mass sense electrodes) based on the magnitude of the angular velocity and the motion imparted by the drive mass. The design of the suspended spring-mass system may be such that the proof masses 210a, 210b have minimal movement out of the MEMS plane in the absence of angular velocity about the sense axis.

In the exemplary embodiment of FIG. 2, the movement of the proof masses 210a, 210b out of the MEMS plane may be sensed using electrostatic sensing as depicted in FIG. 2. Fixed proof mass sense electrodes 208a, 208b, 208c, and 208d are located parallel to the proof masses (e.g., on substrate layer 204 below proof masses 210a, 210b) to form capacitors with portions of the proof masses (e.g., electrode 208a forms a capacitor with a first portion of proof mass 210a, electrode 208b forms a capacitor with a second portion of proof mass 210a, electrode 208c forms a capacitor with a first portion of proof mass 210b, and electrode 208d forms a capacitor with a second portion proof mass 210b). The capacitance of each of the proof masses may change based on the relative distance between each proof mass portion and its associated proof mass sense electrodes. In the embodiment of FIG. 2, these capacitances and the capacitances sensed by the drive mass sense electrodes are used by processing circuitry (e.g., in the substrate layer 204) to determine the inertial force (e.g., by demodulating and compensating the sensed movement of the proof masses to isolate the Coriolis force from other forces and signals, such as a quadrature signal of the MEMS gyroscope structure). Although electrostatic sensing is described in the embodiment of FIG. 2, other forms of sensing (e.g., piezoelectric, infrared, or magnetic) may be used in other embodiments. While some or all of the processing circuitry may be described as located within a substrate layer 204 (e.g., a CMOS substrate layer), in some embodiments a substrate may not include active processing components and may instead simply perform functions such as routing signals to other processing circuitry (e.g., on adjacent components to the MEMS sensor and/or stacked on layers above or below the substrate or cap of the MEMS sensor).

Figure 3:
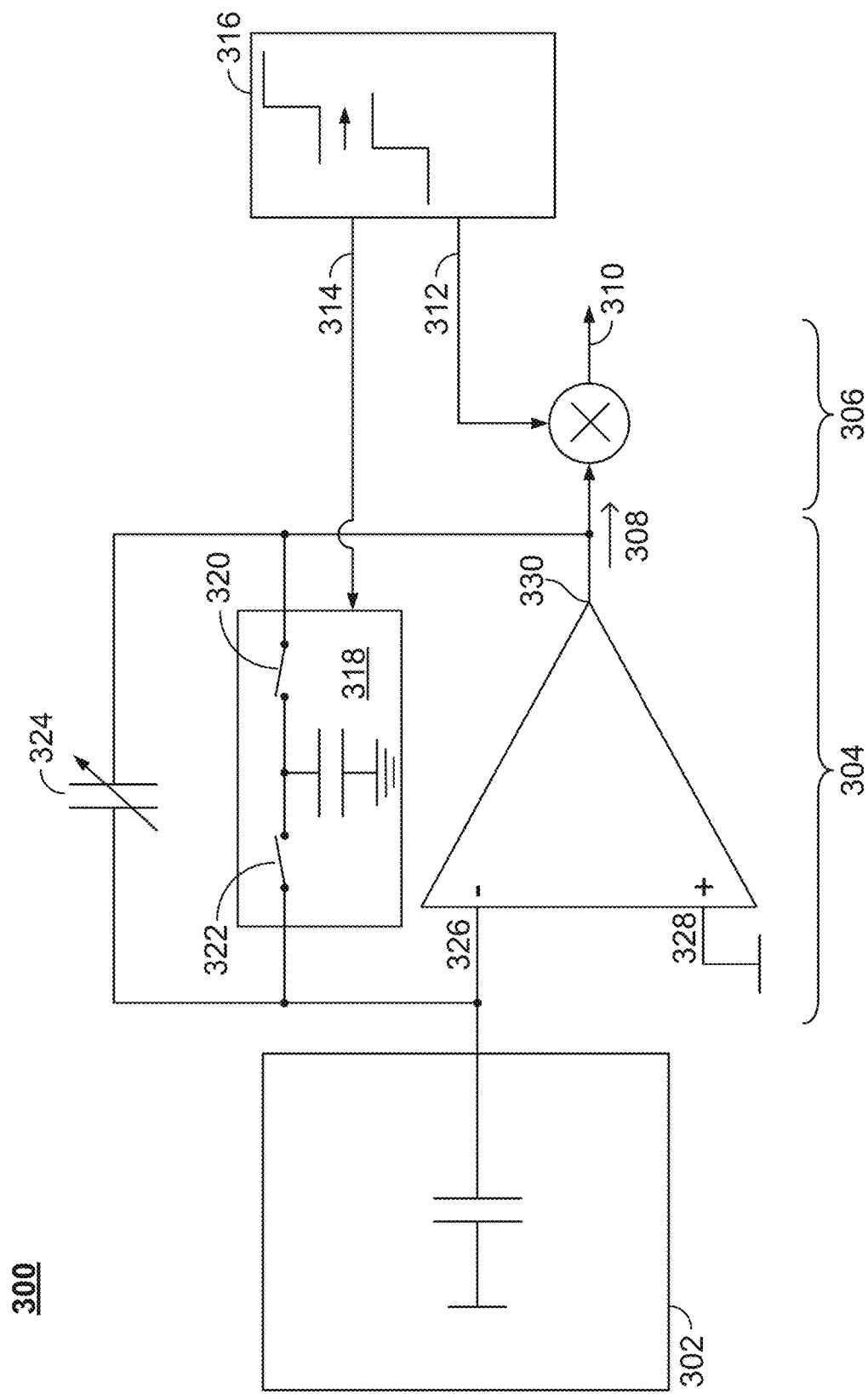
FIG. 3 shows an illustrative circuit diagram of the amplifier feedback network in accordance with an embodiment of the present disclosure.

FIG. 3 shows an illustrative circuit diagram of the amplifier feedback network in accordance with an embodiment of the present disclosure. In the depicted embodiment, system 300 includes MEMS structure 302, sense amplifier 304, demodulator 306, sensed capacitance-to-voltage (sc2v) amplifier noise 308, output noise 310, demodulation signal 312, switching signal 314, signal generator 316, switching capacitor 318, first control switch 320, second control switch 322, and feedback capacitor 324. In some embodiments, output noise 310 may be referred to as period average noise. Although particular components are depicted in certain configurations for system 300, components may be removed, modified, or substituted (e.g., by changing the amplifier from single ended to fully differential) and additional components (e.g., switches, capacitors, converters, processing circuitry, etc.) may be added in certain embodiments.

MEMS structure 302 includes a sensor (e.g., a gyroscope such as MEMS gyroscope 200 or MEMS gyroscope 102, an accelerometer, a barometer, a magnetometer, etc.) that includes a suspended spring-mass system, which, in response to a signal (e.g., an injected test signal, a drive signal, etc.) or an external force (e.g., a tilt, a bend, a rotation, an acceleration, etc.), displaces a proof mass with respect to sense electrodes (e.g., forming moving capacitors) to generate a capacitive output in accordance with the movement of the proof mass (e.g., the internal, movable MEMS component). In some embodiments, the capacitive output may include quadrature and/or in-phase components. In some embodiments, MEMS structure 302 may include processing circuitry configured to generate in-phase and quadrature displacement signals based on the capacitive output. MEMS structure 302 couples to a first node 326 of sense amplifier 304 (e.g., a virtual ground, which may be a node maintained at a reference potential without being connected directly to the reference potential) to deliver the capacitive output. MEMS structure 302 may deliver any number of capacitive signals to sense amplifier 304. Sense amplifier 304 includes a first node 326 (e.g., a virtual ground), which is shown coupled to MEMS structure 302, a second side of a switching capacitor 318, and a feedback capacitor 324. The sense amplifier 304 may have a second node 328, which is shown coupled to an electrical ground (e.g., common node), and an output node 330 which is shown coupled to demodulator 306, a first side of switching capacitor 318, and feedback capacitor 324. As will be discussed further below, the switching capacitor 318 and feedback capacitor 324 may be coupled in parallel to the first node 326 and the output node 330. Sense amplifier 304 receives the capacitive output (e.g., an input charge signal) from MEMS structure 302 and a feedback charge signal from the switching capacitor 318 during a second portion of a duty cycle of switching signal 314 (e.g., when the first control switch 320 is open and the second control switch 322 is closed such that the switching capacitor 318 discharges to the first node 326 of sense amplifier 304—virtual ground), which produces a direct current (DC) circuit feedback impedance (e.g., $f_{sw}$=0 Hz). In some embodiments, a low direct current (DC) circuit feedback impedance of system 300 is desired to provide a stable voltage for any leakage (e.g., leaking current contributing to a voltage drop across sense amplifier 304) received at the first node 326 of the sense amplifier 304 (e.g., virtual ground), which might affect the MEMS output signal of sense amplifier 304. In some embodiments, a high circuit feedback impedance of system 300 is desired at the MEMS driving frequency $f_{drive}$ to significantly reduce noise generated by sense amplifier 304 (e.g., resulting in no feedback network noise) due to the inversely proportional relationship sc2v amplifier noise 308 has with circuit feedback impedance. In embodiments where $f_{drive}$ is the MEMS driving frequency, the feedback capacitor has a capacitance $C_{fb}$, and the feedback resistor has an equivalent resistance $R_{fb}$ at $f_{drive}$. As a result, the noise caused by the feedback resistance at frequency $f_{drive}$ and temperature T may be approximated as:

$$\frac{\sqrt{4kT}}{2\pi f_{drive} C_{fb}} \frac{\sqrt{2}}{\sqrt{R_{fb}}} \left[ \frac{nV}{\sqrt{Hz}} \right]$$

where k represents the Boltzmann constant.

The noise power is inversely proportional to $R_{fb}$, and, therefore, the root mean square (rms) noise is inversely proportional to its square root. Low impedance signifies a low voltage drop due to leakage current. For example, assuming a leakage current of 10 pA and an acceptable voltage drop of 10 mV, low DC impedance means <1 Gohm. Accordingly, high circuit impedance at a frequency of the switching signal, $f_{sw}$, minimizes sc2v amplifier noise 308 converted to output noise 310 after demodulation of the MEMS output signal at demodulator 306. Sense amplifier 304 gain, which, at a high value, reduces the system level impact of the switching behavior by switching capacitor 318, does not need to be reduced in order to cause sc2v amplifier noise 308 to be negligible at demodulator 306 output (e.g., the period average of output noise 310 equals zero). A high circuit impedance of system 300 is relatively greater than a low circuit impedance of system 300. As noted above, low impedance generally signifies a low voltage drop due to leakage current. Assuming a leakage current of 10 pA and an acceptable voltage drop of 10 mV, in one example, low DC impedance means <1 Gohm and high DC impedance means >10 Gohm.

Demodulator 306 is shown coupled to the output node 330 of sense amplifier 304 to receive the MEMS output signal (e.g., including sc2v amplifier noise 308) and additionally receives demodulation signal 312 from signal generator 316, which filters out sc2v amplifier noise 308 from the MEMS output signal and produces minimal output noise 310 (e.g., a period average noise) without reducing the gain of sense amplifier 304. Sc2v amplifier noise 308 (e.g., sample noise) represents the amount of noise the switching behavior of switching capacitor 318, determined by a frequency of the switching signal 314, $f_{sw}$, contributes to sense amplifier 304 and partially composes the MEMS output signal measured at the output node 330 of sense amplifier 304. In some embodiments, switching signal 314 frequency, $f_{sw}$, may equal demodulation signal 312 frequency, $f_{dmd}$ (e.g., $f_{sw}=f_{dmd}$), in which case the sc2v amplifier noise 308 is a sampled signal period of T=1/$f_{dmd}$, as shown by equation (1) below:

$$sc2v(t) = \sum_{k=-\infty}^{\infty} A_k rect\left(\frac{t-kT}{T}\right) \quad (1)$$

where $A_k$ is an amount of noise switching capacitor 318 contributes to sc2v amplifier noise 308 during the k-th period of the switching signal 314. The stochastic variable $A_k$ comes from a white noise process:

$$E[A_k] = 0 \quad k = 0, \pm 1, \pm 2, \ldots$$

$$E[A_k A_m] = \begin{cases} \sigma^2 & k = m \\ 0 & k \neq m \end{cases} \quad k = 0, \pm 1, \pm 2, \ldots$$

Output noise 310 is generated by demodulator 306 and is delivered to external components of system 300. In some embodiments, the period average noise over the demodulator 306 period equals zero if particular criteria (e.g., $f_{sw}=N*f_{dmd}$, where N=1 or 2, and the switching signal 314 is in quadrature (e.g., 90 degrees out-of-phase) with respect to the demodulation signal 312) are met. For example, in some embodiments the period average noise over the demodulator 306 period may equal zero if switching signal 314 frequency, $f_{sw}$, equals demodulation signal 312 frequency, $f_{dmd}$ (e.g., $f_{sw}=N*f_{dmd}$, where N=1), and the switching signal 314 is in-phase with respect to the demodulation signal 312. However, system 300 may be susceptible to poor noise filtering performance in lower frequency ranges (e.g., 100 Hz-1 kHz) in such embodiments, where the sample noise is not filtered out at system level, as a result of the frequency $f_{sw}$ of the switching signal 314 being in-phase with the demodulation signal 312. Poor noise filtering is described below in relation to FIG. 11B where, assuming the feedback network is the dominant noise source, the system noise increases by a factor of approximately 10 from 47.37 nV/sqrt(Hz) to 4.32 nV/sqrt(Hz). In some embodiments, the period average noise over the demodulator 306 period may not equal zero (e.g., residual sc2v amplifier noise 308 is not filtered by demodulation signal 312 and remains with output noise 310) if switching signal 314 frequency, $f_{sw}$, is a second order harmonic of demodulation signal 312 frequency, $f_{dmd}$ (e.g., $f_{sw}=N*f_{dmd}$, where N=2), and the switching signal 314 is in-phase with respect to the demodulation signal 312. In some embodiments, output noise 310 may be referred to as DC noise, as described herein. Output noise 310 may described by equation (2) below:

$$\text{out}(t) = \sum_{k=-\infty}^{\infty} A_k y\left(\frac{t-kT}{T}\right) \quad (2)$$

where y(t) equals the demodulator output (e.g., output noise 310). Signal generator 316 delivers switching signal 314 to switching capacitor 318, where, during a first portion (e.g., $\phi_1$) of the duty cycle of switching signal 314, switching signal 314 charges switching capacitor 318 while the first control switch 320 is closed and the second control switch 322 is open. During a second portion (e.g., $\phi_2$) of the duty cycle of switching signal 314, switching capacitor 318 discharges to the first node 326 of sense amplifier 304 (e.g., virtual ground) while first control switch 320 is open and second control switch 322 is closed. Signal generator 316 determines the switching signal 314 frequency, $f_{sw}$, and a phase shift of the switching signal 314 relative to the demodulation signal 312. The demodulation signal frequency, $f_{dmd}$, must be the same as the driving frequency, $f_{drive}$, which is also the frequency of the signal from the MEMS in order to convert the MEMS signal to a DC signal. The signal generator switching signal frequency/phase requirements are described in the disclosure herein. The frequency and the phase shift of the switching signal are obtained from a high frequency phase-locked loop (PLL) whose input is locked to the driving frequency, $f_{drive}$. As described above, a period average noise of output noise 310 may generally be equal to zero when certain criteria are met regarding the switching signal 314 and the demodulation signal 312. For example, where the frequency $f_{sw}$ of the switching signal 314 is an integer multiple of the frequency $f_{dmd}$ of the demodulation signal 312 (e.g., $f_{sw}=N^*f_{dmd}$, where N=1 or 2), and the switching signal 314 is in quadrature (e.g., 90 degrees out-of-phase) with respect to the demodulation signal 312, a period average noise of output noise 310 may be equal to zero.

Switching capacitor 318, which includes first control switch 320 and second control switch 322, is arranged in parallel with feedback capacitor 324 and is shown coupled to the first node 326 of sense amplifier 304 (e.g., virtual ground) and the output node 330. Feedback capacitor 324, aligned in parallel with switching capacitor 318, is coupled to the first node 326 of sense amplifier 304 (e.g., virtual ground) and the output node 330 of sense amplifier 304. Feedback capacitor 324 contributes to the feedback charge signal that is delivered to the first node 326 of sense amplifier 304 (e.g., virtual ground).

Figure 4:
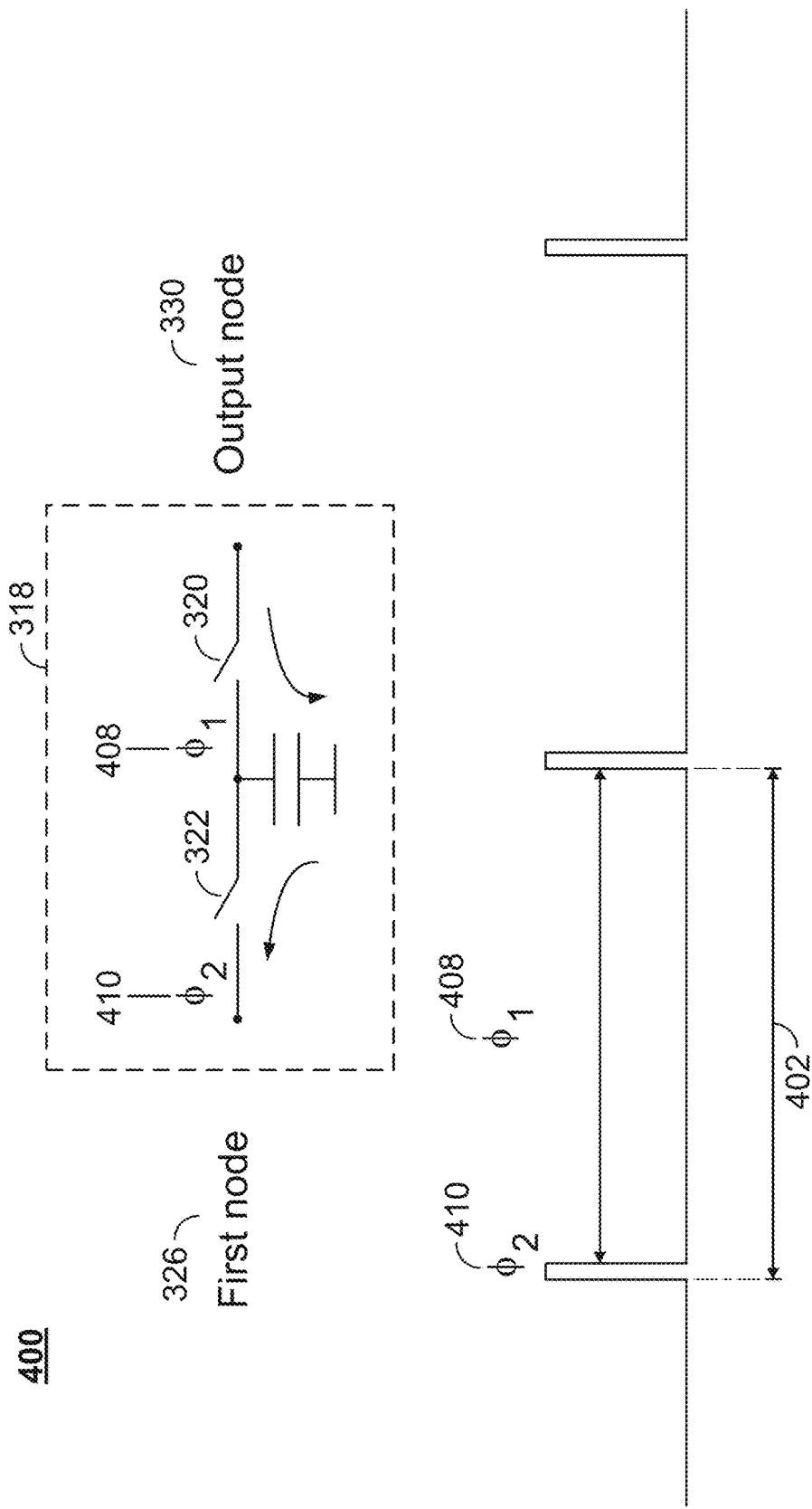
FIG. 4 shows an illustrative switching capacitor with a corresponding waveform in accordance with an embodiment of the present disclosure.

FIG. 4 shows an illustrative switching capacitor with a corresponding waveform in accordance with an embodiment of the present disclosure. In the depicted embodiment, system 400 includes switching signal frequency, $f_{sw}$, 402, first node 326 (e.g., virtual ground), output node 330, first duty cycle portion (e.g., #1) 408, and second duty cycle portion (e.g., $\phi_2$) 410. In addition, system 400 includes switching capacitor 318, first control switch 320, and second control switch 322 of system 300. Although particular components are depicted in certain configurations for system 400, components may be removed, modified, or substituted and additional components (e.g., switches, capacitors, etc.) may be added in certain embodiments.

A signal generator (not shown in FIG. 4) may determine the switching signal frequency, $f_{sw}$, 402. Any frequency may be employed for the switching signal frequency, $f_{sw}$, 402 that is convenient. In some embodiments, demodulation signal frequency, $f_{dmd}$, may fall within a range of 10 kHz-50 kHz, in which case switching signal frequency, $f_{sw}$, may be the same as or double the value of $f_{dmd}$ (e.g., 10 kHz-100 kHz). Switching signal frequency, $f_{sw}$, 402, in some embodiments, may be up to two times the demodulation signal frequency, $f_{dmd}$ (e.g., $f_{sw}=N^*f_{dmd}$, where N=1, 2). In at least some examples, to achieve a period average noise equal to zero (e.g., where sc2v amplifier noise does not contribute to output noise of the system), switching signal frequency, $f_{sw}$, 402 may be equal to or be a second harmonic of demodulation signal frequency, $f_{dmd}$ (e.g., $f_{sw}=N^*f_{dmd}$, where N=1 or 2), and the switching signal may be in quadrature (e.g., 90 degrees out-of-phase) with respect to the demodulation signal. In some examples, the switching signal may be 85 to 95 degrees out-of-phase with respect to the demodulation signal. Switching signal frequency, $f_{sw}$, 402 generally may control the rate at which the first control switch 320 and the second control switch 322 respectively couple and decouple from the switching capacitor 318 within system 400 in accordance with the first portion of the duty cycle (e.g., 4i) 408 and the second portion of the duty cycle (e.g., $\phi_2$) 410. As noted above, $\phi_1$ 408 may generally represent a first period or portion of a duty cycle of the switching signal where the first control switch 320 is closed and the second control switch 322 is open (e.g., the switching capacitor 318 is connected to output node 330 of the sense amplifier and charging by receiving the switching signal from the signal generator). As also discussed above, $\phi_2$ 410 may generally represent a second period or portion of the duty cycle of the switching signal where the first control switch 320 is open and the second control switch 322 is closed (e.g., the switching capacitor 318 is connected and discharging to the first node 326 of the sense amplifier—virtual ground). The first control switch 320 connects between a first side of the switching capacitor 318 and output node 330 of the sense amplifier, while the second control switch 322 connects between a second side of the switching capacitor 318 and first node 326 of the sense amplifier (e.g., virtual ground). The first portion $\phi_1$ 408 and second portion $\phi_2$ 410 may each last any time duration allowed by the switching signal frequency, $f_{sw}$, 402. Further, the first portion and second portion may comprise any relative portion of the duty cycle that is convenient. Accordingly, while the second portion $\phi_2$ 410 is shown in examples herein as being relatively shorter in duration than the first portion $\phi_1$ 408, example illustrations are not necessarily limited arrangements where the second portion $\phi_2$ 410 is shorter than the first portion $\phi_1$ 408.

FIG. 5A shows an illustrative waveform where a switching signal frequency equals a demodulation signal frequency and the switching signal is in quadrature with the demodulation signal, in accordance with an embodiment of the present disclosure. In the depicted embodiment, waveform 500A generally results from a combination of the switching signal 314, sensed capacitance-to-voltage (sc2v) amplifier noise 308, demodulation signal 312, and output noise 310. Accordingly, the resulting waveform 500A has characteristics resulting from these constituent signals. Although particular components are depicted in certain configurations for waveform 500A, components may be removed, modified, or substituted and additional components may be added in certain embodiments.

Switching and demodulation signal characteristics 502 describe how the frequency of the switching signal 314, $f_{sw}$, equals the frequency of the demodulations signal, $f_{dmd}$ (e.g., $f_{sw}=f_{dmd}$), and the switching signal 314 is in quadrature (e.g., 90 degrees out-of-phase) with respect to the demodulation signal 312. In some embodiments, switching signal 314 may be 85 to 95 degrees out-of-phase with respect to demodulation signal 312. At the exemplary frequency of the switching signal 314, $f_{sw}$, the switching capacitor discharges once (e.g., during the second portion of the duty cycle ($\phi_2$) 410) and charges once (e.g., during the first portion of the duty cycle ($\phi_1$) 408) during the period of the switching signal 314. Sc2v amplifier noise 308, which represents the switching capacitor (e.g., switching capacitor 318) latching to system noise at each indication of the switching capacitor discharging, remains constant during the first portion of the duty cycle (e.g., 4i) 408 because the switching capacitor is charging and not connected to the first node of the sense amplifier (e.g., virtual ground). Output noise 310 equals a product of sc2v amplifier noise 308 (e.g., sample noise) and demodulation signal 312. Accordingly, during a first quarter of period average noise 504, output noise 310 equals +1 due to both sc2v amplifier noise 308 and demodulation signal 312 equaling +1. During a second and third quarter of period average noise 504, output noise 310 equals −1 because sc2v amplifier noise 308 equals +1 and demodulation signal 312 equals −1. During a last, fourth quarter of period average noise 504, output noise 310 equals +1 because sc2v amplifier noise 308 and demodulation signal 312 both equal +1. As a result, period average noise 504 at demodulator output equals zero. In this example, the period average noise 504 corresponds with the demodulator period.

FIG. 5B shows an illustrative waveform where the switching signal frequency is double the demodulation signal frequency, and the switching signal is in quadrature with the demodulation signal in accordance with an embodiment of the present disclosure. In the depicted embodiment, waveform 500B generally results from a combination of the switching signal 314, sensed capacitance-to-voltage (sc2v) amplifier noise 308, demodulation signal 312, and output noise 310. Accordingly, the resulting waveform 500B has characteristics resulting from these constituent signals. Although particular components are depicted in certain configurations for waveform 500B, components may be removed, modified, or substituted and additional components may be added in certain embodiments.

Switching and demodulation signal characteristics 506 generally describe how the frequency of the switching signal 314, $f_{sw}$, is double the frequency of the demodulation signal 312, $f_{dmd}$ (e.g., $f_{sw}=2*f_{dmd}$), and the switching signal 314 is in quadrature (e.g., 90 degrees out-of-phase) with respect to the demodulation signal 312. In some embodiments, switching signal 314 may be 85 to 95 degrees out-of-phase with respect to demodulation signal 312. At the exemplary frequency of the switching signal 314, $f_{sw}$, which is double the switching signal frequency depicted in waveform 500A of FIG. 5A, the switching capacitor 318 discharges twice (e.g., during the second portion of the duty cycle ($\phi_2$) 410a, 410b) and charges twice (e.g., during the first portion of the duty cycle (di) 408a, 408b) during the period of the switching signal 314. Sc2v amplifier noise 308, which represents the switching capacitor (e.g., switching capacitor 318) latching to system noise at each indication of the switching capacitor discharging, remains constant during the first portion of the duty cycle (e.g., $\phi_1$) 408a, 408b because the switching capacitor is charging and not connected to the first node of the sense amplifier (e.g., virtual ground). Output noise 310 equals a product of sc2v amplifier noise 308 (e.g., sample noise) and demodulation signal 312. Accordingly, during a first quarter of period average noise 508, output noise 310 equals +1 due to both sc2v amplifier noise 308 and demodulation signal 312 equaling +1. During a second quarter of period average noise 508, output noise 310 equals −1 because sc2v amplifier noise 308 equals +1 and demodulation signal 312 equals −1. During a third quarter of period average noise 508, output noise 310 equals approximately +½ because sc2v amplifier noise 308 equals approximately −½ and demodulation signal 312 equals −1. During a last, fourth quarter of period average noise 508, output noise 310 equals approximately −½ because sc2v amplifier noise 308 equals approximately −½ and demodulation signal 312 equals +1. As a result, period average noise 508 at demodulator output equals zero. It will be understood that period average noise 508 corresponds with the demodulator period.

Figure 6A:
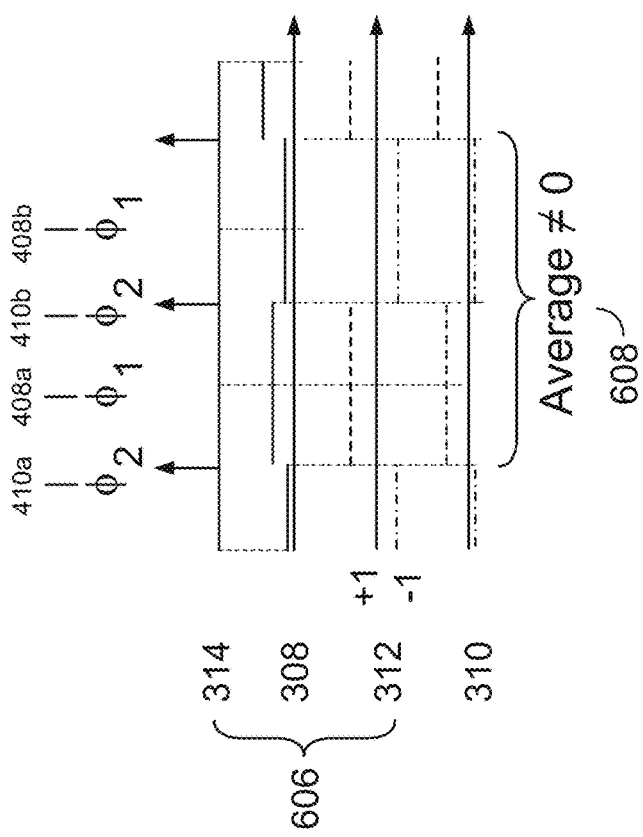
FIG. 6A shows an illustrative waveform where a switching signal frequency equals a demodulation signal frequency, and the switching signal is in-phase with the demodulation signal in accordance with an embodiment of the present disclosure.

FIG. 6A shows an illustrative waveform where a switching signal frequency equals a demodulation signal frequency, and the switching signal is in-phase with the demodulation signal in accordance with an embodiment of the present disclosure. In the depicted embodiment, waveform 600A generally results from a combination of the switching signal 314, sensed capacitance-to-voltage (sc2v) amplifier noise 308, demodulation signal 312, and output noise 310. Accordingly, the resulting waveform 600A has characteristics resulting from these constituent signals. Although particular components are depicted in certain configurations for waveform 600A, components may be removed, modified, or substituted and additional components may be added in certain embodiments.

Switching and demodulation signal characteristics 602 describe how the frequency of the switching signal 314, $f_{sw}$, equals the frequency of the demodulation signal 312, $f_{dmd}$ (e.g., $f_{sw}=f_{dmd}$), and the switching signal 314 is in-phase with respect to the demodulation signal 312. At the exemplary frequency of the switching signal 314, $f_{sw}$, the switching capacitor discharges once (e.g., during the second portion of the duty cycle/period ($\phi_2$) 410) and charges once (e.g., during the first portion of the duty cycle/period ($\phi_1$) 408) of the switching signal 314. Sc2v amplifier noise 308, which represents the switching capacitor (e.g., switching capacitor 318) latching to system noise at each indication of the switching capacitor discharging, remains constant during the first portion (e.g., $\phi_1$) 408 because the switching capacitor is charging and not connected to the first node of the sense amplifier (e.g., virtual ground). Output noise 310 is equal to a product of sc2v amplifier noise 308 (e.g., sample noise) and demodulation signal 312. Accordingly, during a first and second quarter of period average noise 604, output noise 310 equals +1 because both sc2v amplifier noise 308 and demodulation signal 312 equal +1. During a third and fourth quarter of period average noise 604, output noise 310 equals −1 because sc2v amplifier noise 308 equals +1 and demodulation signal 312 equals −1. As a result, period average noise 604 at demodulator output equals zero. It will be understood that period average noise 604 corresponds with the period of the demodulation signal 312. In some embodiments, switching and demodulation signal characteristics (e.g., in-phase and $f_{sw}=f_{dmd}$) 602 may offer poor noise filtering performance at a lower frequency range (e.g., 100 Hz-1 kHz), where the noise is not filtered out at system level.

Figure 6B:
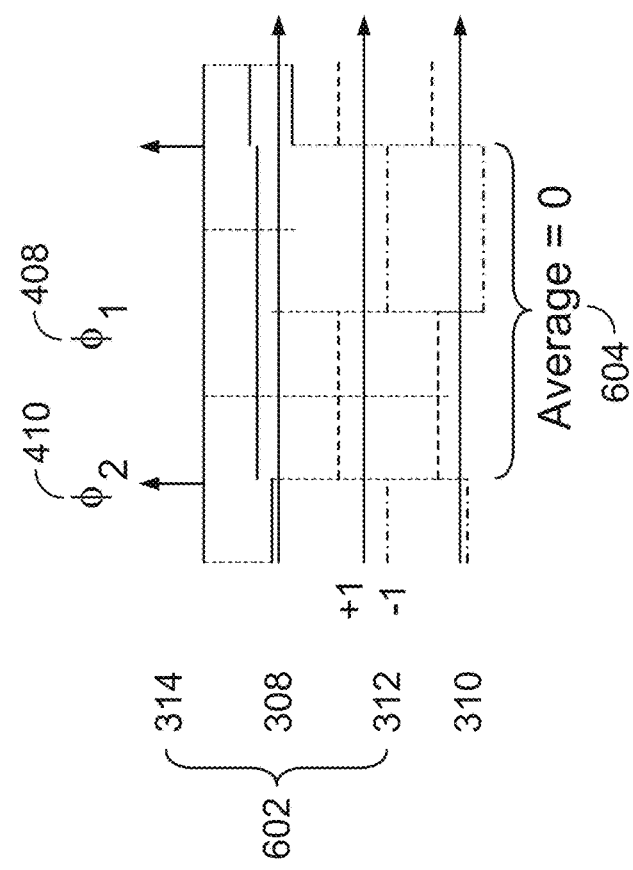
FIG. 6B shows an illustrative waveform where a switching signal frequency is double the demodulation signal frequency, and the switching signal is in-phase with the demodulation signal, in accordance with an embodiment of the present disclosure.

FIG. 6B shows an illustrative waveform where a switching signal frequency is double the demodulation signal frequency, and the switching signal is in-phase with the demodulation signal, in accordance with an embodiment of the present disclosure. In the depicted embodiment, waveform 600B generally results from a combination of the switching signal 314, sensed capacitance-to-voltage (sc2v) amplifier noise 308, demodulation signal 312, and output noise 310. Accordingly, the resulting waveform 600B has characteristics resulting from these constituent signals. Although particular components are depicted in certain configurations for waveform 600B, components may be removed, modified, or substituted and additional components may be added in certain embodiments.

Switching and demodulation signal characteristics 606 describe how the frequency of the switching signal 314, $f_{sw}$, is double the frequency of the demodulation signal 312, $f_{dmd}$ (e.g., $f_{sw}=2*f_{dmd}$), and the switching signal 314 is in-phase with respect to the demodulation signal 312. At the exemplary frequency of the switching signal 314, $f_{sw}$, which is double the switching signal frequency depicted in waveform 600A of FIG. 6A, the switching capacitor (e.g., switching capacitor 318) discharges twice (e.g., during the second portion ($\phi_2$) 410a, 410b) and charges twice (e.g., during the first portion ($\phi_1$) 408a, 408b) of the duty cycle (e.g., period) of the switching signal 314. Sc2v amplifier noise 308, which represents the switching capacitor latching to system noise at each indication of the switching capacitor discharging, remains constant during the first portion (e.g., $\phi_1$) 408a, 408b because the switching capacitor is charging and not connected to the first node of the sense amplifier (e.g., virtual ground). Output noise 310 equals a product of sc2v amplifier noise 308 (e.g., sample noise) and demodulation signal 312. Accordingly, during a first and second quarter of period average noise 608, output noise 310 equals +1 because both sc2v amplifier noise 308 and demodulation signal 312 equal +1. During a third and fourth quarter of period average noise 608, output noise equals approximately −½ because sc2v amplifier noise 308 equals +½ and demodulation signal 312 equals −1. As a result, period average noise 608 at demodulator output does not equal zero (e.g., residual noise from sc2v amplifier noise 308 is not filtered by demodulation signal 312 and escapes via demodulator output). It will be understood that period average noise 608 corresponds to an average noise throughout the period of the demodulation signal 312.

Figure 7:
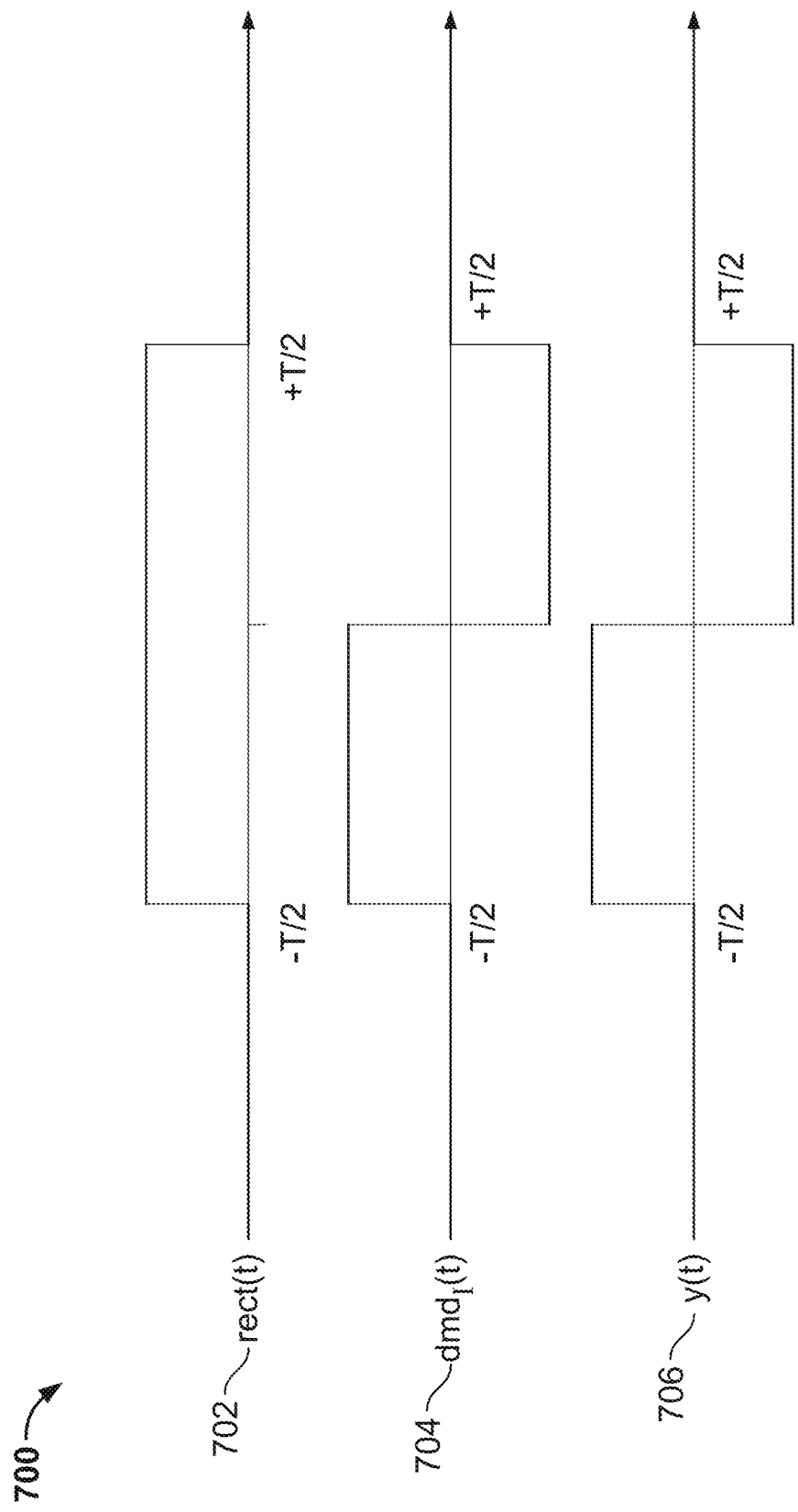
FIG. 7 shows illustrative waveforms depicting a switching signal in-phase with a demodulation signal and a corresponding demodulator output in accordance with an embodiment of the present disclosure.

FIG. 7 shows illustrative waveforms depicting a switching signal in-phase with a demodulation signal and a corresponding demodulator output in accordance with an embodiment of the present disclosure. Waveform 700 includes rect(t) 702 (e.g., a switching signal), $dmd_I(t)$ 704 (e.g., an in-phase demodulation signal), and y(t) 706 (e.g., a demodulator output signal). In the depicted embodiment of FIG. 7, rect(t) 702 is in-phase with $dmd_I(t)$ 704 and the frequency of rect(t) 702 (e.g., switching signal frequency, $f_{sw}$) equals the frequency of $dmd_I(t)$ 704 (e.g., in-phase demodulation signal frequency, $f_{dmd}$). Accordingly, the period average noise of y(t) 706 at demodulator output equals zero (e.g., $dmd_I(t)$ 704 substantively filters out sc2v amplifier noise at the demodulator). The output noise power spectral density averaged on a time interval [$t_1$, $t_2$] compared to a demodulator period is provided by equation (3) below:

$$N(\omega)|_{[t_1,t_2]} = \sigma^2 \frac{|Y(j\omega)|^2}{t_2 - t_1} \quad (3)$$

where $Y(j\omega)$ is the Fourier transform of y(t) 706, which depends on the phase shift between rect(t) 702 (e.g., the switching signal) and $dmd_I(t)$ 704 (e.g., the demodulation signal). In the instance where rect(t) 702 is in-phase with $dmd_I(t)$ 704, such as in FIG. 7, the Fourier transform of y(t) 706 may be determined by equation (4) below:

$$Y(j\omega) = -\int_{-\frac{T}{2}}^{-\frac{T}{4}} e^{-j\omega t} dt + \int_{-\frac{T}{4}}^{+\frac{T}{4}} e^{-j\omega t} dt - \int_{+\frac{T}{4}}^{+\frac{T}{2}} e^{-j\omega t} dt = -\frac{2}{j\omega}\left[1 - \cos\left(\frac{\omega T}{2}\right)\right] \quad (4)$$

In some embodiments, $dmd_I(t)$ 704 may offer relatively poor noise filtering performance at a lower frequency range (e.g., 100 Hz-1 kHz), e.g., such that noise is not filtered out at a system level, in contrast to other approaches described herein. Poor noise filtering is described below in relation to FIG. 11B where, assuming the feedback network is the dominant noise source, the system noise increases by a factor of approximately 10 from 47.37 nV/sqrt(Hz) to 4.32 nV/sqrt(Hz). In some embodiments, the frequency of rect(t) 702 (e.g., switching signal frequency, $f_{sw}$) may be a second order harmonic of the frequency of $dmd_I(t)$ 704 (e.g., in-phase demodulation signal frequency, $f_{dmd}$), in which case the period average noise of y(t) 706 does not equal zero (e.g., residual noise from sc2v amplifier noise is not filtered by $dmd_I(t)$ 704 and escapes via y(t) 706).

Figure 8:
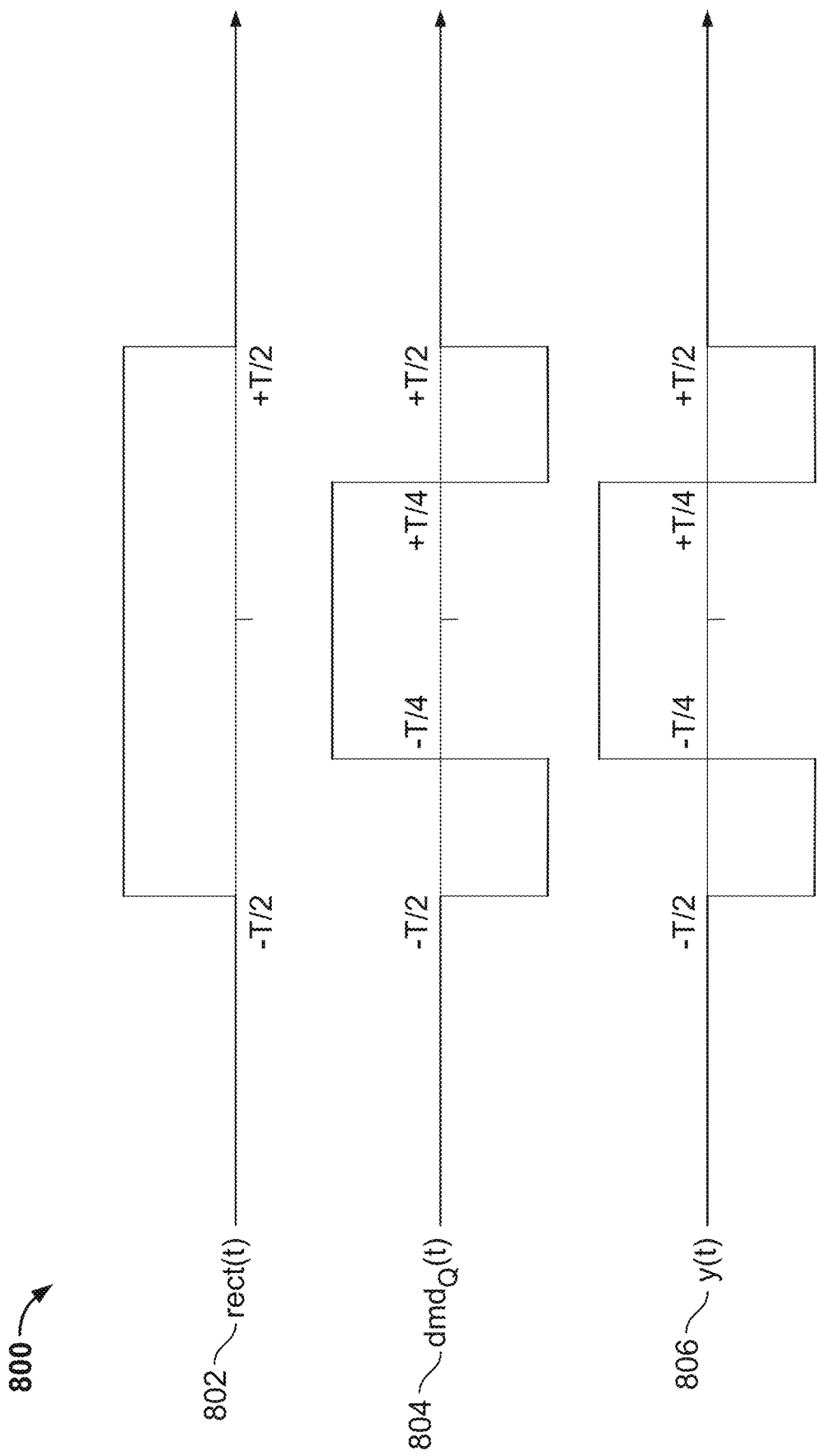
FIG. 8 shows illustrative waveforms depicting a switching signal in quadrature with a demodulation signal and a corresponding demodulator output in accordance with an embodiment of the present disclosure.

FIG. 8 shows illustrative waveforms depicting a switching signal in quadrature with a demodulation signal and a corresponding demodulator output in accordance with an embodiment of the present disclosure. Waveform 800 includes rect(t) 802 (e.g., a switching signal), $dmd_Q(t)$ 804 (e.g., a quadrature demodulation signal), and y(t) 806 (e.g., a demodulator output signal). In the depicted embodiment of FIG. 8, rect(t) 802 is in quadrature (e.g., 90 degrees out-of-phase) with respect to $dmd_Q(t)$ 804 and the frequency of rect(t) 802 (e.g., switching signal frequency, $f_{sw}$) equals the frequency of $dmd_Q(t)$ 804 (e.g., quadrature demodulation signal frequency, $f_{dmd}$). In some embodiments, rect(t) 802 may be 85 to 95 degrees out-of-phase with respect to $dmd_Q(t)$ 804. The period average noise of y(t) 806 at demodulator output equals zero (e.g., $dmd_Q(t)$ 804 substantively filters out sc2v amplifier noise at the demodulator). In the instance where rect(t) 802 is in quadrature with $dmd_Q(t)$ 804, such as in FIG. 8, the Fourier transform of y(t) 806 may be determined by equation (5) below:

$$Y(j\omega) = -\int_{-\frac{T}{2}}^{-\frac{T}{4}} e^{-j\omega t} dt + \int_{-\frac{T}{4}}^{+\frac{T}{4}} e^{-j\omega t} dt - \int_{+\frac{T}{4}}^{+\frac{T}{2}} e^{-j\omega t} dt = \quad (5)$$

$$-\frac{1}{j\omega}\left\{-\left[e^{-j\omega t}\right]_{-\frac{T}{2}}^{-\frac{T}{4}} + \left[e^{-j\omega t}\right]_{-\frac{T}{4}}^{+\frac{T}{4}} - \left[e^{-j\omega t}\right]_{+\frac{T}{4}}^{+\frac{T}{2}}\right\} =$$

$$-\frac{1}{j\omega}\left\{-e^{j\omega T/4} + e^{j\omega T/2} + e^{-j\omega T/4} - e^{j\omega T/4} - e^{-j\omega T/2} + e^{-j\omega T/4}\right\} =$$

$$\frac{4}{\omega}\sin\left(\frac{\omega T}{4}\right)\left[1 - \cos\left(\frac{\omega T}{4}\right)\right]$$

In some embodiments, the frequency of rect(t) 802 (e.g., switching signal frequency, $f_{sw}$) may be a second order harmonic of the frequency of $dmd_Q(t)$ 804 (e.g., quadrature demodulation signal frequency, $f_{dmd}$), in which case the period average noise of y(t) 806 equals zero (e.g., no sc2v amplifier noise escapes at a system level).

Figure 9:
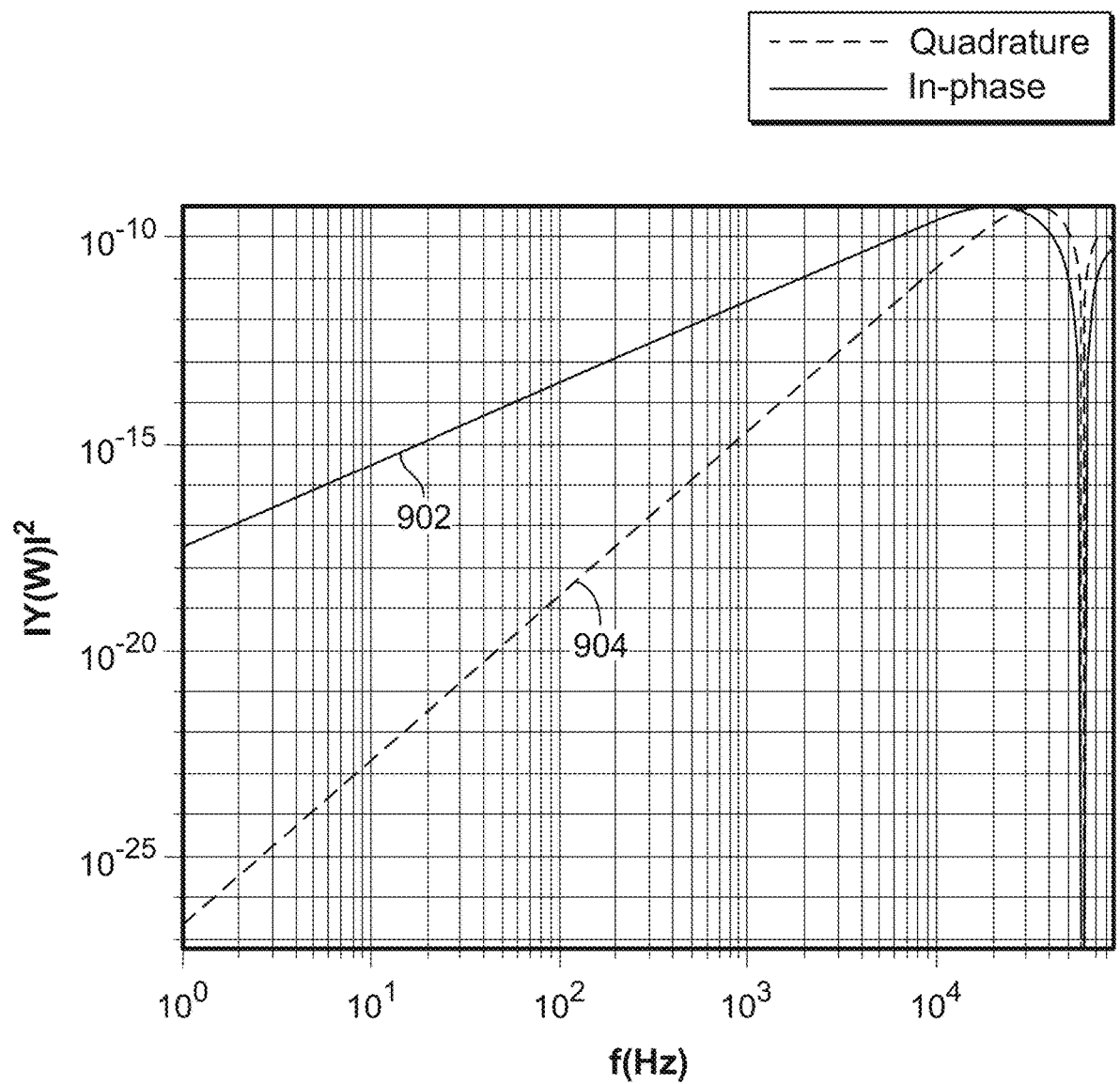
FIG. 9 shows an example diagram depicting in-phase and quadrature sense transfer functions versus switching signal frequency in accordance with an embodiment of the present disclosure.

FIG. 9 shows an example diagram depicting in-phase and quadrature sense transfer functions versus switching signal frequency in accordance with an embodiment of the present disclosure. Both the in-phase sense transfer function 902 and the quadrature sense transfer function 904 approach zero at a direct current (DC) voltage (e.g., when switching signal frequency, $f_{sw}$, equals zero due to the switching capacitor being coupled to the first node of the sense amplifier—virtual ground). However, the slope of quadrature sense transfer function 904 is greater than the slope of in-phase sense transfer function 902, which conveys that at a low frequency range (e.g., 10 Hz to 1 kHz) the quadrature sense transfer function 904 performs better noise reduction by approximately five orders of magnitude compared to in-phase sense transfer function 902.

Figure 10:
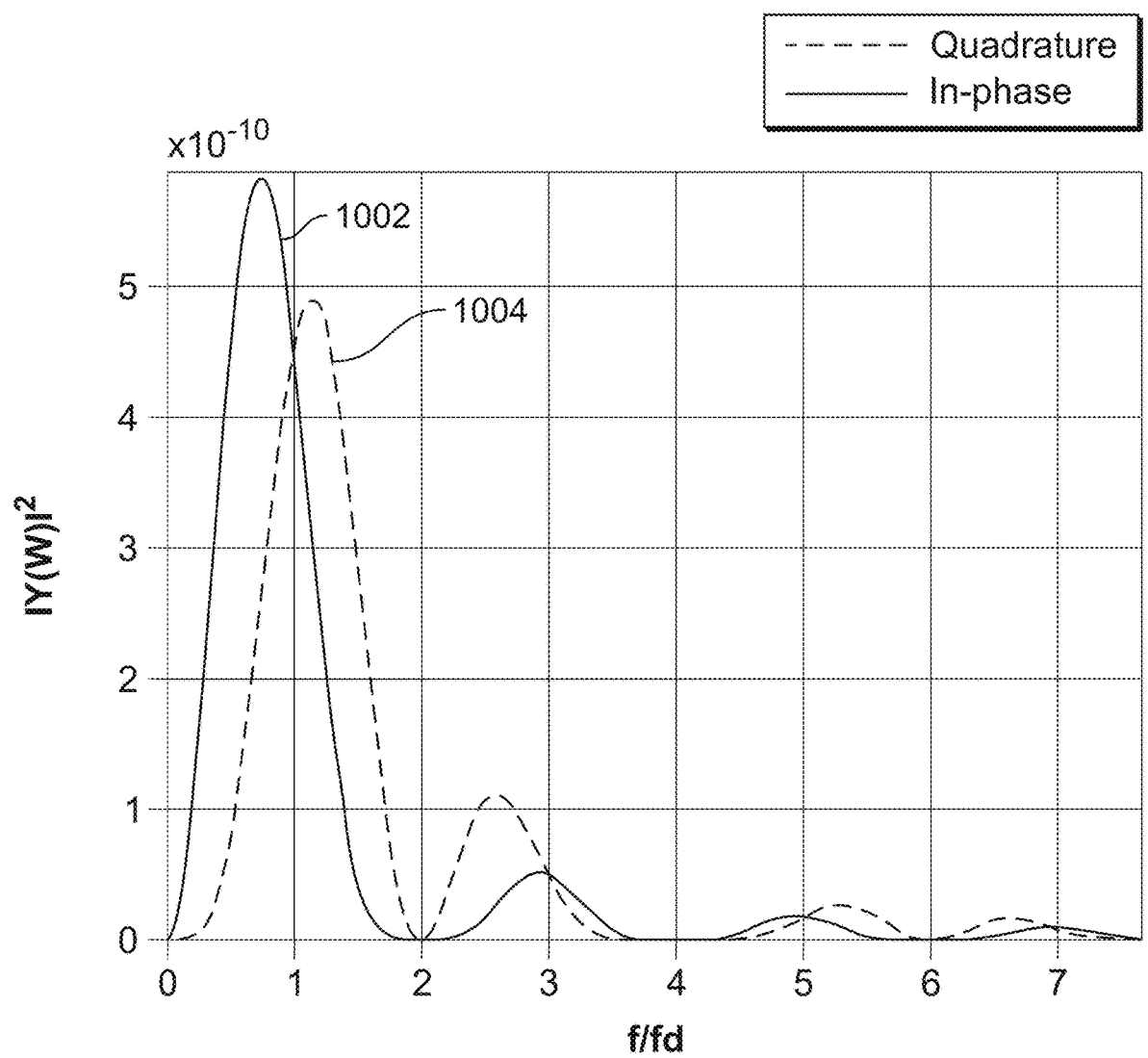
FIG. 10 shows an example diagram depicting in-phase and quadrature sense transfer functions versus a ratio of switching signal frequency and demodulation signal frequency in accordance with an embodiment of the present disclosure.

FIG. 10 shows an example diagram depicting in-phase and quadrature sense transfer functions versus a ratio of switching signal frequency and demodulation signal frequency in accordance with an embodiment of the present disclosure. The plot of in-phase sense transfer function 1002 and quadrature sense transfer function 1004 conveys that the position of zeros and the overall noise power does not depend on phase shift. For example, the sense transfer function 1002 and the quadrature sense transfer function 1004 each are at zero where a ratio of switching signal frequency to demodulation signal frequency is 2:1.

Figure 11B:
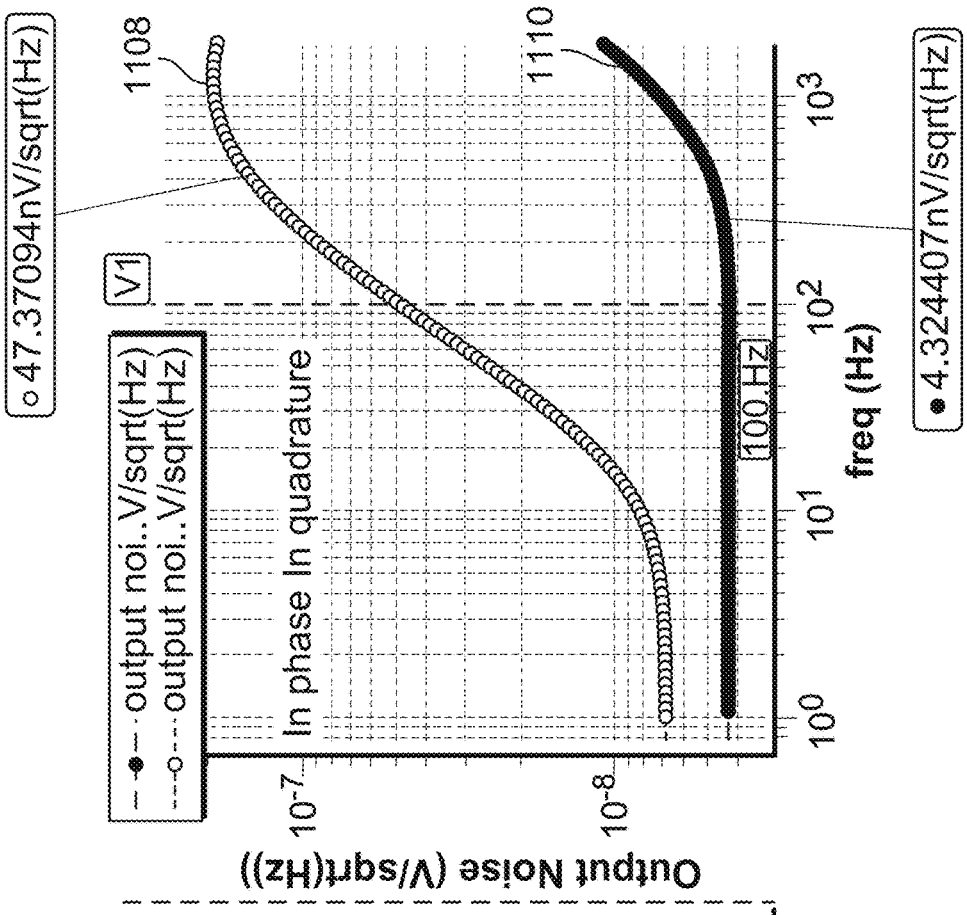
FIG. 11B shows an example simulation diagram depicting in-phase and quadrature output noise as a function of frequency in accordance with an embodiment of the present disclosure.
Figure 11A:
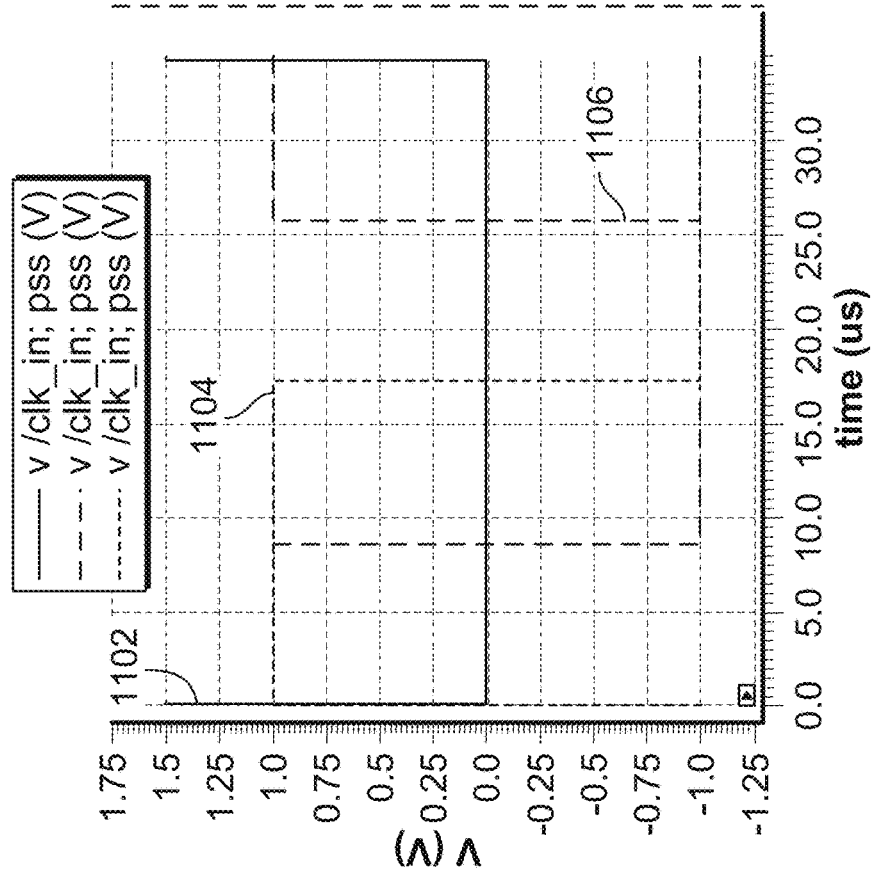
FIG. 11A shows illustrative simulation waveforms depicting a switching signal with corresponding in-phase and quadrature demodulation signals in accordance with an embodiment of the present disclosure.

FIG. 11A shows illustrative simulation waveforms depicting a switching signal with corresponding in-phase and quadrature demodulation signals in accordance with an embodiment of the present disclosure. In the depicted waveform, the frequency of switching signal 1102, $f_{sw}$, equals the frequency of in-phase and quadrature demodulation signals 1104, 1106, $f_{dmd}$, at 29 kHz (e.g., $f_{sw}=f_{dmd}=29$ kHz). Accordingly, switching signal 1102 (e.g., a switching capacitor clock) has a duty cycle (e.g., period) of approximately 30.48 μs (e.g., T=1/$f_{sw}$, where $f_{sw}$=29 kHz). Switching signal 1102 charges a switching capacitor (e.g., via a closed first control switch and an open second control switch) during a first portion (e.g., $\phi_1$) of the duty cycle of switching signal 1102 (from approximately 0.5 μs to 34 μs) and discharges the switching capacitor (e.g., via an open first control switch and a closed second control switch) to a first node of a sense amplifier (e.g., virtual ground) during a second portion (e.g., $\phi_2$) of the duty cycle of switching signal 1102 (from approximately 0.0 μs to 0.5 μs and 34.0 μs to 34.5 μs). Demodulation signal 1104 is in-phase with respect to switching signal 1102, which, with equal frequencies at 29 kHz, results in a period average noise at demodulator output equal to zero. In some embodiments, in-phase demodulation signal 1104 may offer poor noise filtering at a lower frequency range (e.g., 100 Hz-1 kHz) such that the noise (e.g., sc2v amplifier noise) is not filtered out at system level. In some embodiments, the frequency of switching signal 1102, $f_{sw}$, may be a second order harmonic of the frequency of in-phase demodulation signal 1104, $f_{dmd}$ (e.g., $f_{sw}=2*f_{dmd}$), in which case the period average noise associated with in-phase demodulation signal 1104 doesn't equal zero (e.g., residual sc2v amplifier noise escapes at demodulator output). Demodulation signal 1106 is in quadrature (e.g., 90 degrees out-of-phase) with respect to switching signal 1102, which, with equal frequencies at 29 kHz, results in a period average noise at demodulator output equal to zero. In some embodiments, quadrature demodulation signal 1106 may be 85 to 95 degrees out-of-phase with respect to switching signal 1102. In some embodiments, the frequency of switching signal 1102, $f_{sw}$, may be a second order harmonic of the frequency of quadrature demodulation signal 1106, $f_{dmd}$ (e.g., $f_{sw}=2*f_{dmd}$), in which case the period average noise associated with quadrature demodulation signal 1106 equals zero (e.g., sc2v amplifier noise is substantively filtered out by quadrature demodulation signal 1106).

FIG. 11B shows an example simulation diagram depicting in-phase and quadrature output noise as a function of frequency in accordance with an embodiment of the present disclosure. In the depicted diagram, in-phase output noise 1108, corresponding to in-phase demodulation signal 1104 of FIG. 11A, reads an output noise value equal to 47.37094 nV/sqrt(Hz) at 100 Hz. Contrarily, quadrature output noise 1110, corresponding to quadrature demodulation signal 1106 of FIG. 11A, reads an output noise value equal to 4.324407 nV/sqrt(Hz) at 100 Hz—approximately one order of magnitude less than the in-phase output noise 1108. Both in-phase output noise 1108 and quadrature output noise 1110 approach zero at direct current (DC) voltage (e.g., when switching signal frequency, $f_{sw}$, equals zero), however, quadrature output noise 1110 does so more effectively at a much wider range of relatively low frequencies (e.g., 10 Hz-1 kHz).

Figure 12:
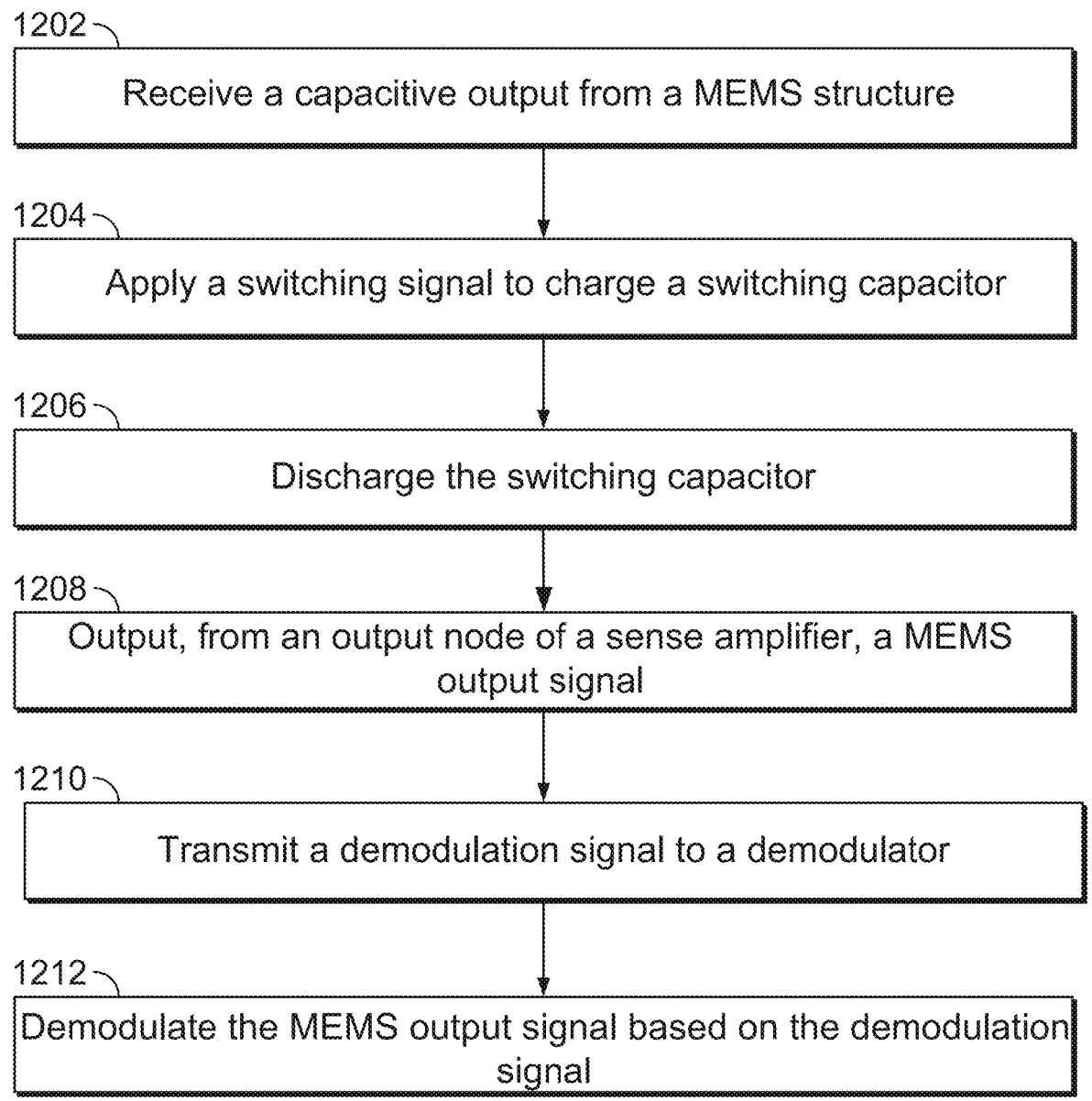
FIG. 12 shows an illustrative flowchart for filtering noise of a capacitive sensing amplifier without reducing amplifier gain in accordance with an embodiment of the present disclosure.

FIG. 12 shows an illustrative flowchart for filtering noise of a capacitive sensing amplifier without reducing amplifier gain in accordance with an embodiment of the present disclosure. Although particular steps are depicted in certain configurations for FIG. 12, steps may be removed, modified, or substituted and additional steps may be added in certain embodiments. At step 1202, processing circuitry receives a capacitive output from a MEMS structure (e.g., MEMS structure 302). For example, as discussed above a capacitive output from MEMS structure 302 may be received at a first node (e.g., first node 326) of a sense amplifier (e.g., sense amplifier 304), which may be a virtual ground. In some embodiments, the capacitive output, corresponding to the displacement of an internal, movable MEMS component in response to an injected signal or external force, may include quadrature and/or in-phase components. The MEMS structure (e.g., MEMS structure 302) may deliver any number of capacitive output signals to the first node (e.g., first node 326) of the sense amplifier (e.g., sense amplifier 304).

At step 1204, processing circuitry may apply a switching signal (e.g., switching signal 314) to charge a switching capacitor (e.g., switching capacitor 318). For example, as discussed above a switching capacitor 318 may be charged during a first portion (e.g., $\phi_1$) 408 of a duty cycle of the switching signal (e.g., switching signal 314). A first control switch (e.g., first control switch 320) may be closed and a second control switch (e.g., second control switch 322) may be open in response to the switching signal (e.g., switching signal 314), resulting in the switching capacitor (e.g., switching capacitor 318) being charged. In some embodiments, a high circuit impedance may be desired during the first portion (e.g., 4i) 408 of the duty cycle of the switching signal (e.g., switching signal 314) to significantly reduce noise (e.g., sensed capacitance-to-voltage (sc2v) amplifier noise 308) generated by the sense amplifier (e.g., sense amplifier 304). Process 1200 may then proceed to step 1206.

At step 1206, processing circuitry may apply the switching signal (e.g., switching signal 314) to discharge the switching capacitor (e.g., switching capacitor 318). For example, as described above the switching capacitor 318 may be discharged to a virtual ground, that is the first node (e.g., first node 326) of the sense amplifier (e.g., sense amplifier 304). The switching capacitor (e.g., switching capacitor 318) may be discharged during a second portion (e.g., $\phi_2$) 410 of the duty cycle of the switching signal (e.g., switching signal 314). Further, the first control switch (e.g., first control switch 320) may be open and the second control switch (e.g., second control switch 322) may be closed to facilitate discharging the switching capacitor (e.g., switching capacitor 318) in response to the switching signal 314. In some embodiments, a low circuit impedance may be desired during the second portion (e.g., $\phi_2$) 410 of the duty cycle of the switching signal (e.g., switching signal 314) to provide a voltage offset for any leakage (e.g., leaking current contributing to a voltage drop across the sense amplifier) received from the switching capacitor (e.g., switching capacitor 318) at the first node (e.g., first node 326) of the sense amplifier (e.g., sense amplifier 304).

Proceeding to step 1208, processing circuitry may output, from an output node (e.g., output node 330) of the sense amplifier (e.g., sense amplifier 304), a MEMS output signal. As discussed above, in at least some examples the MEMS output signal includes sc2v amplifier noise (e.g., sc2v amplifier noise 308), which may result from the switching capacitor (e.g., switching capacitor 318) latching at each indication of the switching capacitor (e.g., switching capacitor 318) discharging. Process 1200 may then proceed to step 1210.

At step 1210, processing circuitry may apply a demodulation signal (e.g., demodulation signal 312) to a demodulator (e.g., demodulator 306). For example, as discussed above demodulator 306 may be coupled to the output node (e.g., output node 330) of the sense amplifier (e.g., sense amplifier 304). Further, in at least some examples a frequency of the switching signal (e.g., switching signal 314) is an integer multiple of a frequency of the demodulation signal (e.g., demodulation signal 312), e.g., equal to or twice as great as the frequency of the demodulation signal 312. A signal generator (e.g., signal generator 316) may determine the frequency and phase shift of the switching signal (e.g., switching signal 314) with respect to the demodulation signal (e.g., demodulation signal 312). In some embodiments, the signal generator (e.g., signal generator 316) may generate the switching signal (e.g., switching signal 314) and the demodulation signal (e.g., demodulation signal 312) in a manner reducing noise in the output. In at least some examples, the switching frequency may be equal to or double the demodulator frequency (i.e., $f_{sw}=N*f_{dmd}$, where N=1 or 2), and the switching signal may also be in quadrature (e.g., 90 degrees out-of-phase) with respect to the demodulation signal. This example arrangement may result in a period average noise equal to zero at the demodulator (e.g., demodulator 306) output, as discussed above. As also discussed above, the switching signal (e.g., switching signal 314) need not be exactly in quadrature with the demodulator signal. Merely as one example, as discussed above a switching signal (e.g., switching signal 314) may be 85 to 95 degrees out-of-phase with respect to the demodulation signal (e.g., demodulation signal 312).

Proceeding to step 1212, processing circuitry may demodulate the MEMS output signal based on the demodulation signal (e.g., demodulation signal 312). For example, as discussed above the demodulator (e.g., demodulator 306) may receive the demodulation signal (e.g., demodulation signal 312) from the signal generator (e.g., signal generator 316), which filters sc2v amplifier noise (e.g., sc2v amplifier noise 308) from the MEMS output signal such that over a demodulator period the average output noise (e.g., output noise 310) equals zero. A sense amplifier (e.g., sense amplifier 304) gain, which, at a high value, reduces the system level impact of the switching behavior by the switching capacitor (e.g., switching capacitor 318), does not need to be reduced in order to make sc2v amplifier noise (e.g., sc2v amplifier noise 308) negligible at demodulator (e.g., demodulator 306) output.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical system (MEMS) device, comprising:
   a MEMS structure comprising a capacitive output corresponding to movement of the MEMS structure;
   a sense amplifier with a first node, a second node, and an output node, wherein a feedback capacitor and a switching capacitor are each connected in parallel between the first node and the output node;
   a demodulator coupled to the output node; and
   a signal generator configured to output a demodulation signal to the demodulator and a switching signal having a phase offset relative to the demodulation signal to a first control switch and a second control switch of the switching capacitor, wherein the first control switch is connected between a first side of the switching capacitor and the output node, and wherein the second control switch is connected between a second side of the switching capacitor and the first node.

2. The MEMS device of claim 1, wherein a frequency of the switching signal is equal to a demodulation signal frequency.

3. The MEMS device of claim 1, wherein a frequency of the switching signal is twice as great as a demodulation signal frequency.

4. The MEMS device of claim 1, wherein a phase of the switching signal is in quadrature with respect to a phase of the demodulation signal.

5. The MEMS device of claim 1, wherein a phase of the switching signal is 90 degrees out-of-phase with respect to a phase of the demodulation signal.

6. The MEMS device of claim 1, wherein a phase of the switching signal is 85 to 95 degrees out-of-phase with respect to a phase of the demodulation signal.

7. The MEMS device of claim 1, wherein the switching capacitor is configured to charge when the first control switch is closed and the second control switch is open.

8. The MEMS device of claim 1, wherein the switching capacitor is configured to discharge to a virtual ground when the first control switch is open and the second control switch is closed.

9. The MEMS device of claim 8, wherein the virtual ground is the first node of the sense amplifier.

10. The MEMS device of claim 1, further comprising a first impedance configured to bias a virtual ground of the sense amplifier at a direct current (DC) voltage to offset a leakage from the switching capacitor.

11. The MEMS device of claim 1, wherein the second node of the sense amplifier is connected to ground or to a common node.

12. A method, comprising:
    receiving a capacitive output from a MEMS structure at a first node of a sense amplifier;
    applying a switching signal to charge a switching capacitor based on a first portion of a duty cycle of the switching signal;
    applying the switching signal to discharge the switching capacitor to a virtual ground, wherein the virtual ground is the first node of the sense amplifier, and wherein the discharge of the switching capacitor is based on a second portion of the duty cycle of the switching signal;
    outputting, from an output node of the sense amplifier, a MEMS output signal;
    applying a demodulation signal to a demodulator, wherein the demodulator is coupled to the output node of the sense amplifier, and wherein a frequency of the switching signal is equal to or twice as great as a frequency of the demodulation signal; and demodulating the MEMS output signal based on the demodulation signal.

13. The method of claim 12, wherein a phase of the switching signal is in quadrature with respect to a phase of the demodulation signal.

14. The method of claim 13, wherein, in response to the phase of the switching signal being in quadrature with the phase of the demodulation signal, an average output noise generated over the demodulator period is negligible.

15. The method of claim 12, wherein a phase of the switching signal is 90 degrees out-of-phase with respect to a phase of the demodulation signal.

16. The method of claim 12, wherein a phase of the switching signal is 85 to 95 degrees out-of-phase with respect to a phase of the demodulation signal.

17. The method of claim 12, wherein applying the switching signal to charge the switching capacitor comprises closing a first control switch and opening a second control switch.

18. The method of claim 12, wherein applying the switching signal to discharge the switching capacitor to the virtual ground comprises opening a first control switch and closing a second control switch.

19. The method of claim 12, further comprising biasing, with a first impedance, the virtual ground at a direct current (DC) voltage to offset a leakage from the switching capacitor.

20. The method of claim 12, further comprising a second node of the sense amplifier that is connected to ground or to a common node.

\* \* \* \* \*